United States Patent
Sichler et al.

(10) Patent No.: US 9,876,111 B2
(45) Date of Patent: Jan. 23, 2018

(54) METHOD OF FORMING A SEMICONDUCTOR DEVICE STRUCTURE USING DIFFERING SPACER WIDTHS AND THE RESULTING SEMICONDUCTOR DEVICE STRUCTURE

(71) Applicant: GLOBALFOUNDRIES Inc., Grand Cayman (KY)

(72) Inventors: Steffen Sichler, Dresden (DE); Peter Javorka, Radeburg (DE); Juergen Faul, Radebeul (DE); Sylvain Henri Baudot, Dresden (DE); Thorsten Kammler, Ottendorf-Okrilla (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/091,020

(22) Filed: Apr. 5, 2016

(65) Prior Publication Data

US 2017/0170317 A1    Jun. 15, 2017

(30) Foreign Application Priority Data

Dec. 14, 2015   (DE) .................. 10 2015 225 147
Dec. 15, 2015   (DE) .................. 10 2015 225 330

(51) Int. Cl.
*H01L 29/78*    (2006.01)
*H01L 29/06*    (2006.01)
(Continued)

(52) U.S. Cl.
CPC ...... *H01L 29/7848* (2013.01); *H01L 29/0649* (2013.01); *H01L 29/41783* (2013.01);
(Continued)

(58) Field of Classification Search
CPC .............. H01L 29/78; H01L 29/41783; H01L 27/1203; H01L 29/6656; H01L 29/6653
See application file for complete search history.

(56) References Cited

U.S. PATENT DOCUMENTS

2005/0112817 A1*   5/2005   Cheng ............... H01L 21/82380
                                                                          438/219
2007/0096195 A1*   5/2007   Hoentschel ....... H01L 21/82380
                                                                          257/315
(Continued)

FOREIGN PATENT DOCUMENTS

EP          1531496 A2     5/2015

OTHER PUBLICATIONS

Jaeger, Richard C., Introduction to Microelectronic Fabrication, 1993, Addison-Wesley Publishing Company, Inc., vol. V, pp. 20-21.*

(Continued)

*Primary Examiner* — Marcos D Pizarro
*Assistant Examiner* — Shannon Yi
(74) *Attorney, Agent, or Firm* — Amerson Law Firm, PLLC

(57) ABSTRACT

A method of forming a semiconductor device structure is disclosed including providing a first active region and a second active region in an upper surface portion of a substrate, the first and second active regions being laterally separated by at least one isolation structure, forming a first gate structure comprising a first gate dielectric and a first gate electrode material over the first active region, and a second gate structure comprising a second gate dielectric and a second gate electrode material over the second active region, wherein a thickness of the second gate dielectric is greater than the thickness of the first gate dielectric, and forming a first sidewall spacer structure to the first gate structure and a second sidewall spacer structure to the second gate structure, wherein a lateral thickness of the second sidewall spacer structure is greater than a lateral thickness of the first sidewall spacer structure.

9 Claims, 21 Drawing Sheets

(51) Int. Cl.
 *H01L 29/417* (2006.01)
 *H01L 29/66* (2006.01)
(52) U.S. Cl.
 CPC ...... *H01L 29/6653* (2013.01); *H01L 29/6656* (2013.01); *H01L 29/66484* (2013.01); *H01L 29/7831* (2013.01)

(56) References Cited

U.S. PATENT DOCUMENTS

| | | | |
|---|---|---|---|
| 2009/0218633 A1* | 9/2009 | Hoentschel | H01L 21/82380 |
| | | | 257/369 |
| 2012/0086077 A1 | 4/2012 | Fried et al. | |
| 2013/0161763 A1* | 6/2013 | Ando | H01L 29/78621 |
| | | | 257/408 |
| 2014/0077310 A1* | 3/2014 | Ishii | H01L 21/82 |
| | | | 257/392 |
| 2014/0183642 A1 | 7/2014 | Liang et al. | |
| 2017/0117296 A1* | 4/2017 | Chhun | H01L 27/1203 |

OTHER PUBLICATIONS

Translation of German Office Action dated Jul. 19, 2016 for German Patent Application No. 102016203154.6.

\* cited by examiner

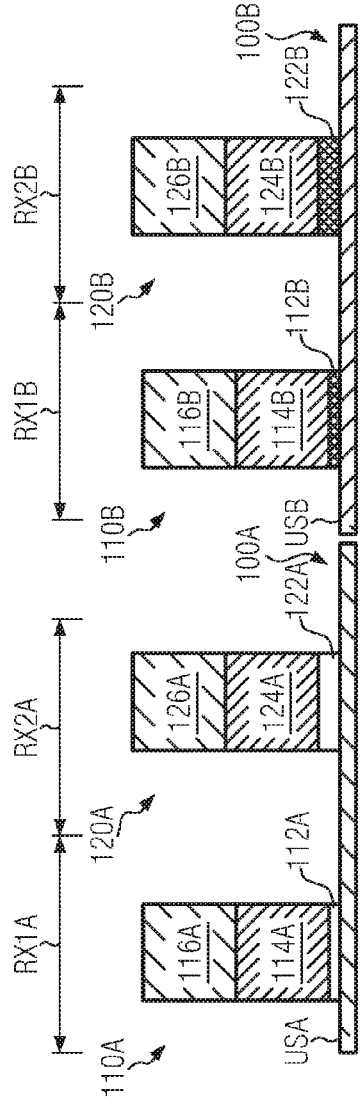
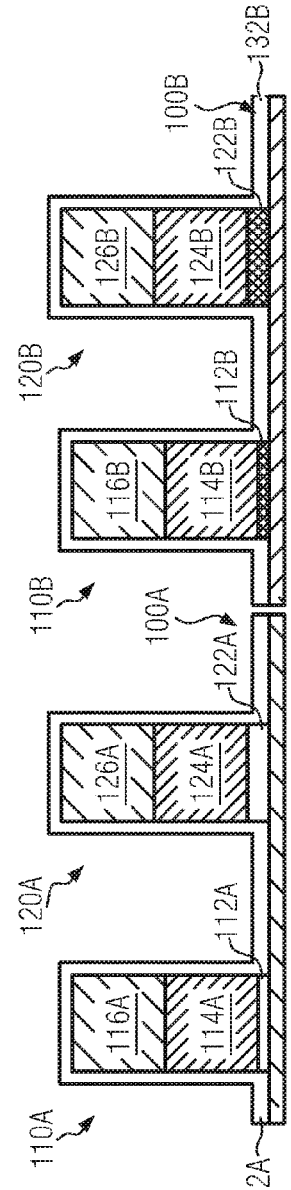
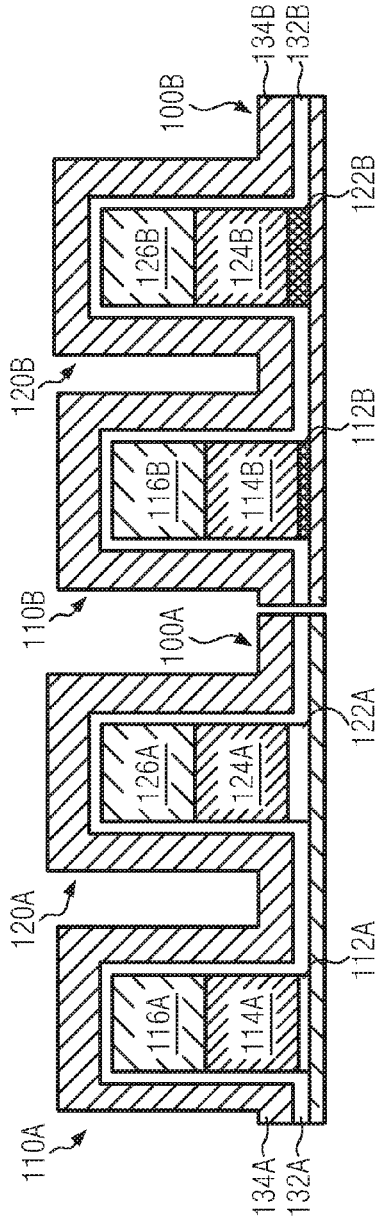
FIG. 1a
FIG. 1b
FIG. 1c

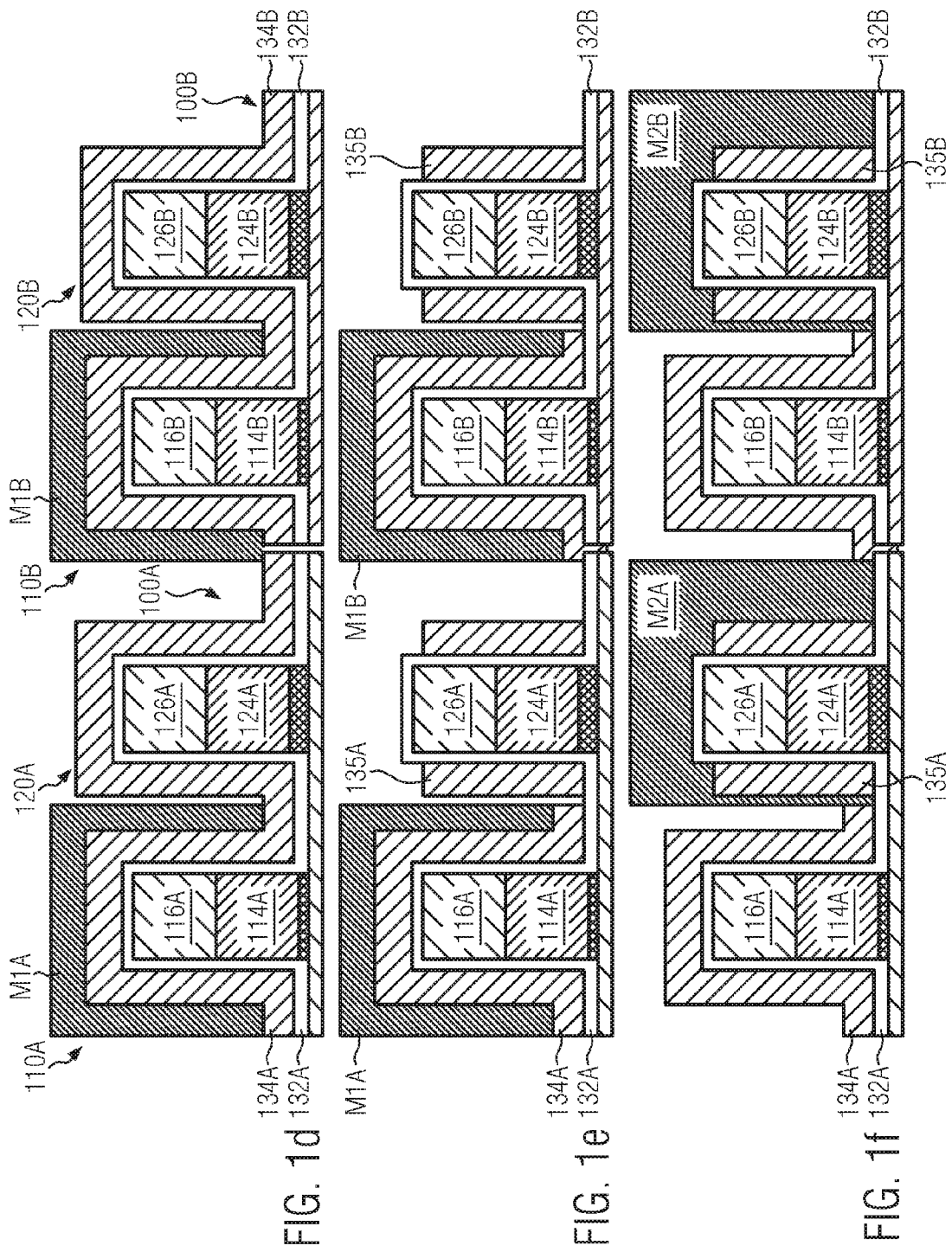

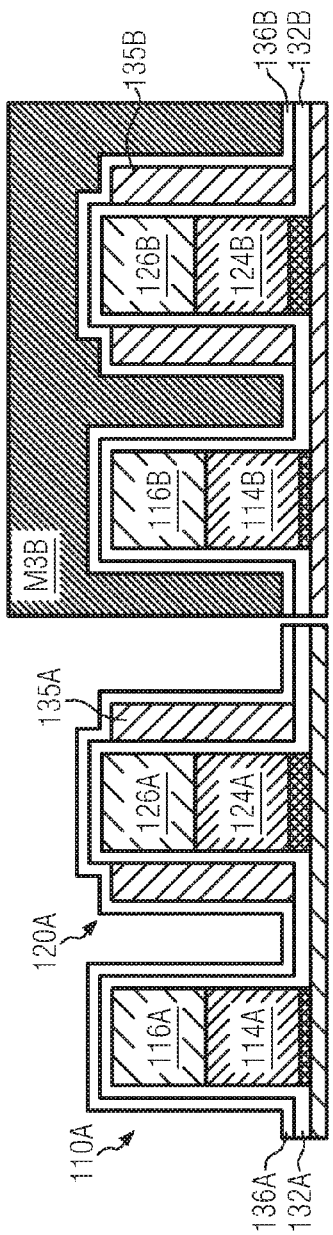
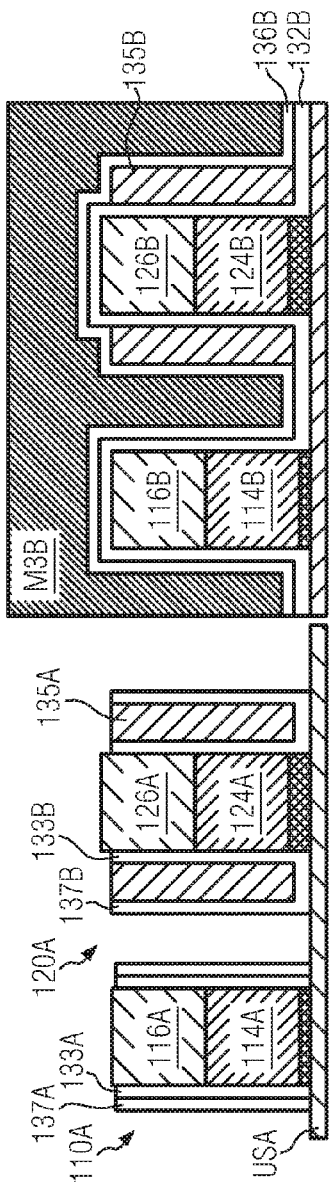
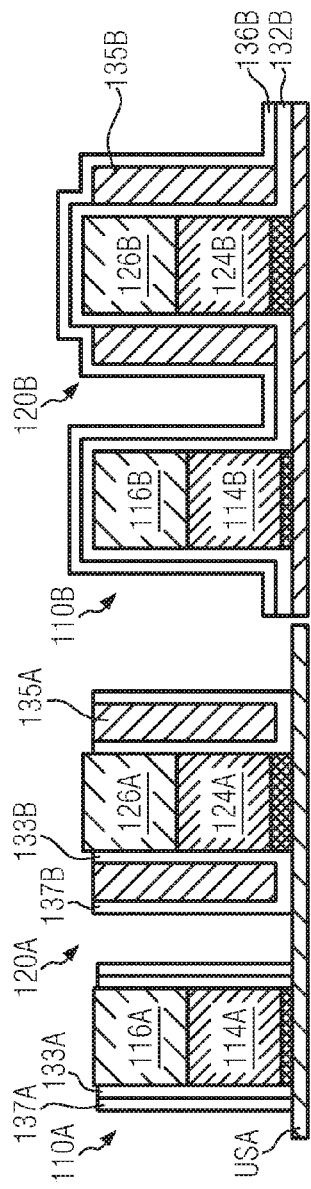
FIG. 1j
FIG. 1k
FIG. 1l

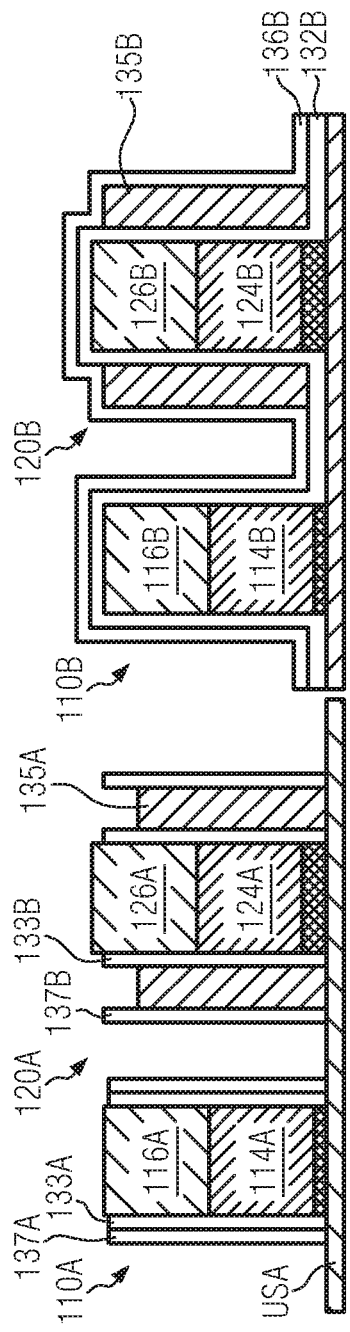
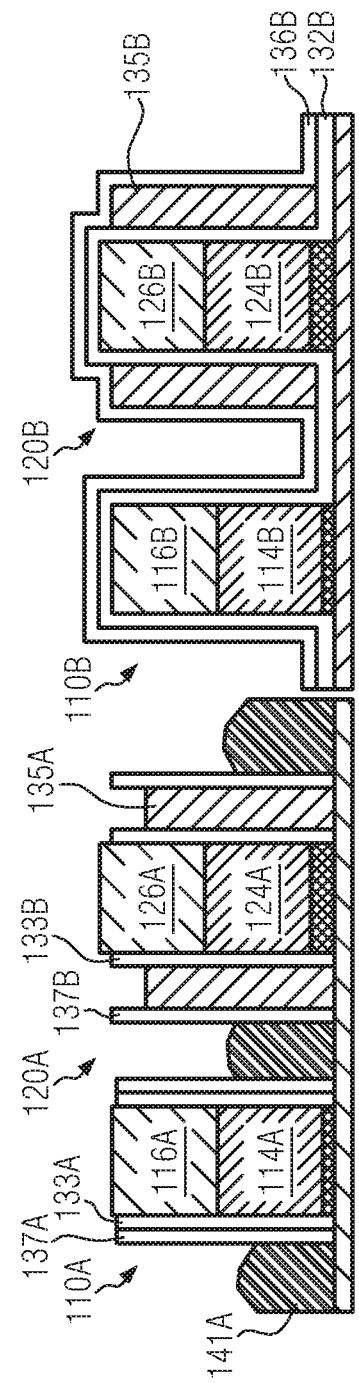

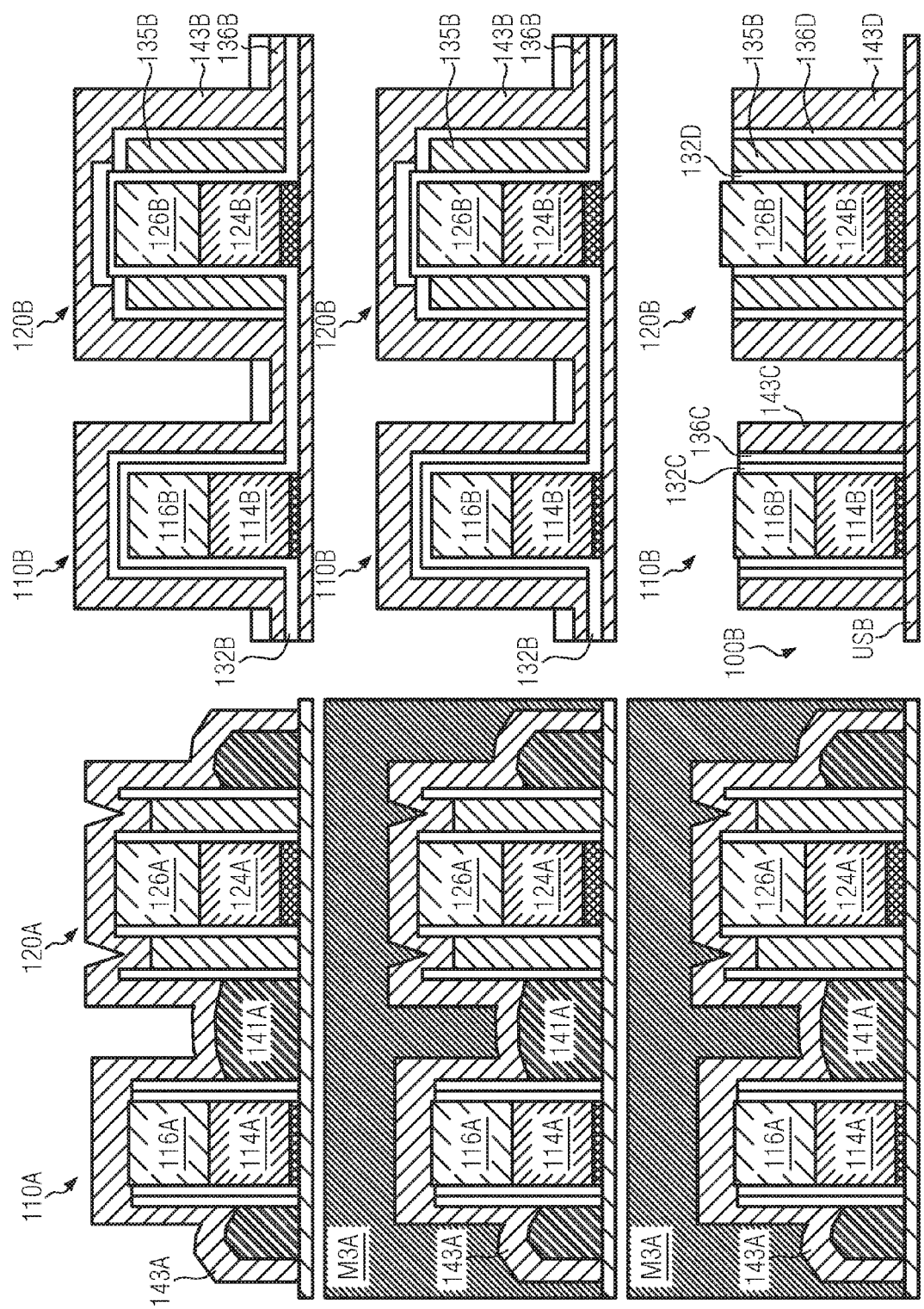

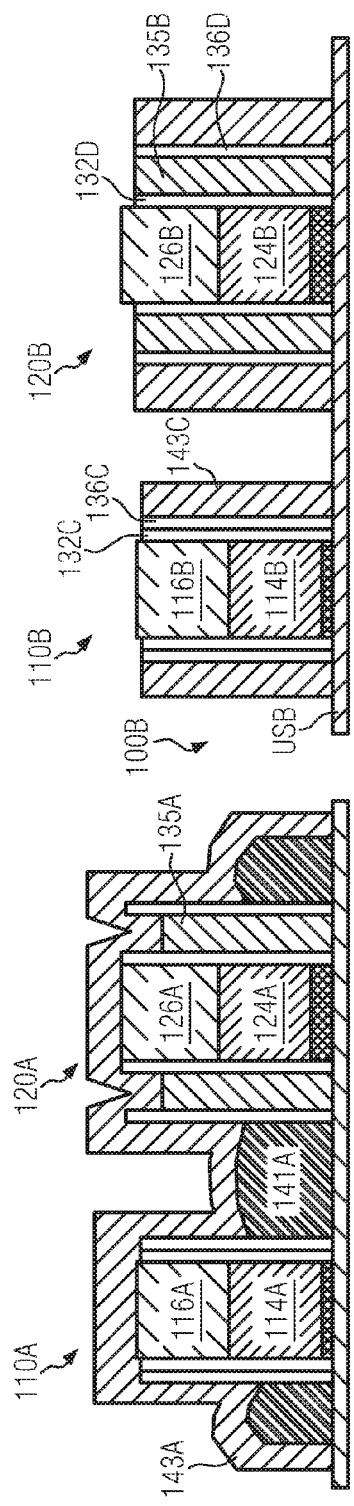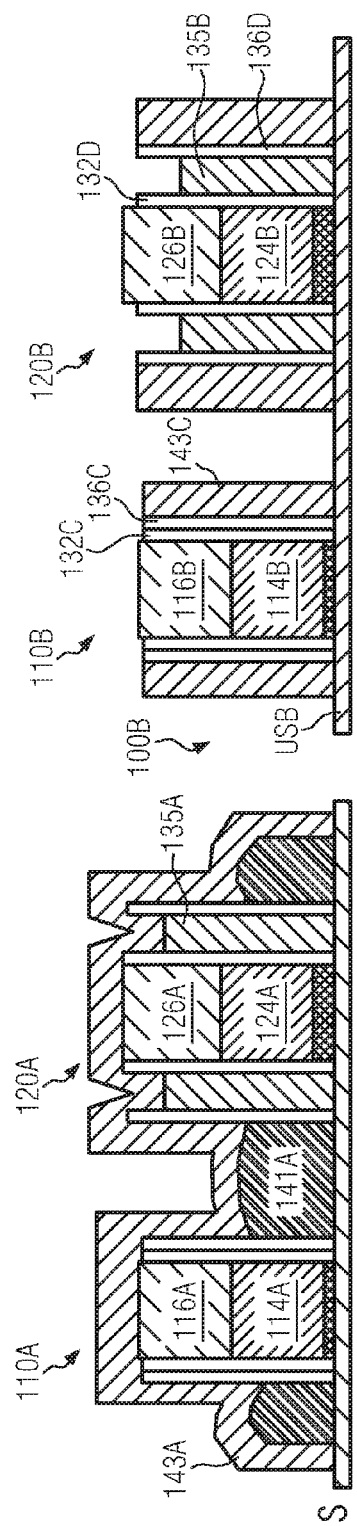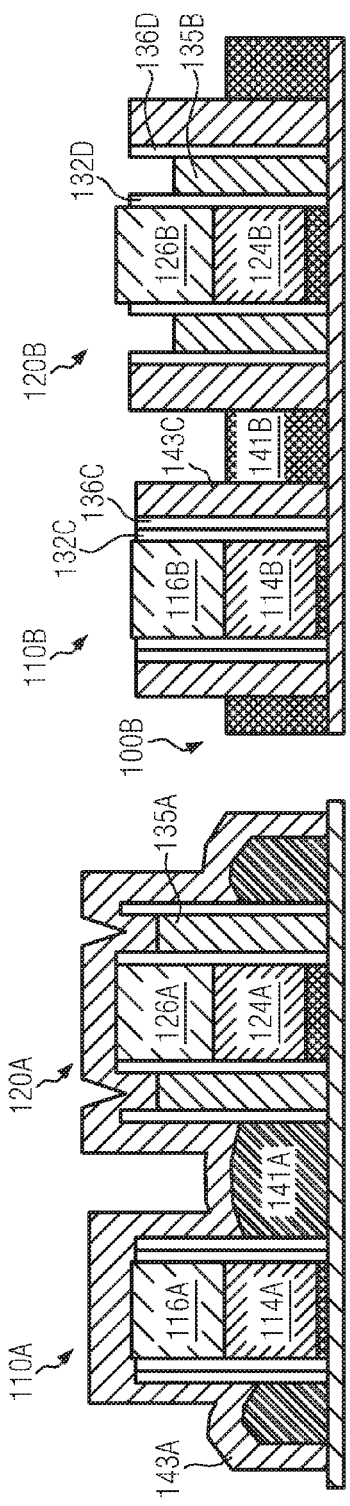

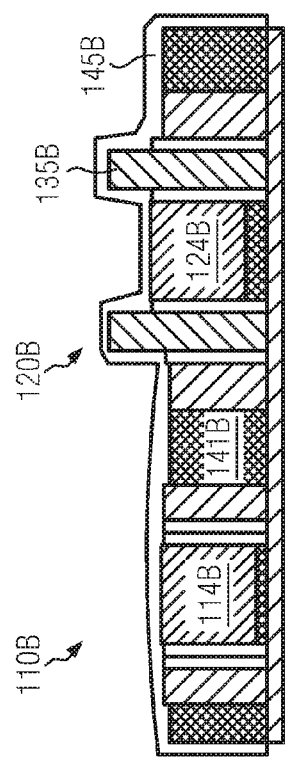
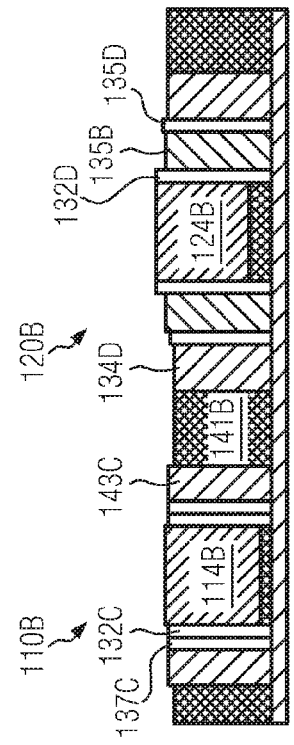
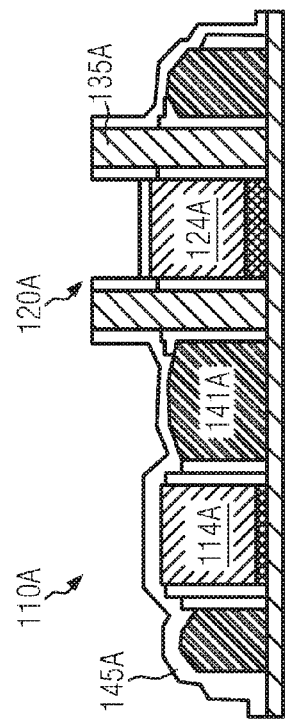
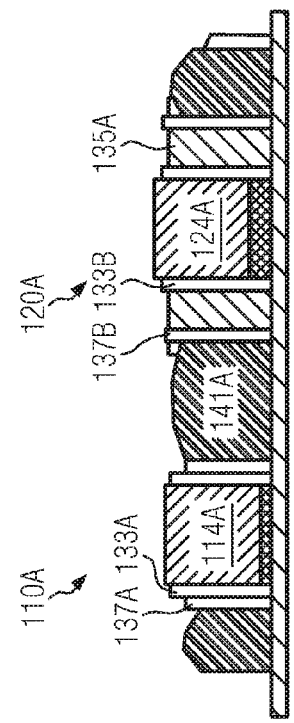
FIG. 1u
FIG. 1v

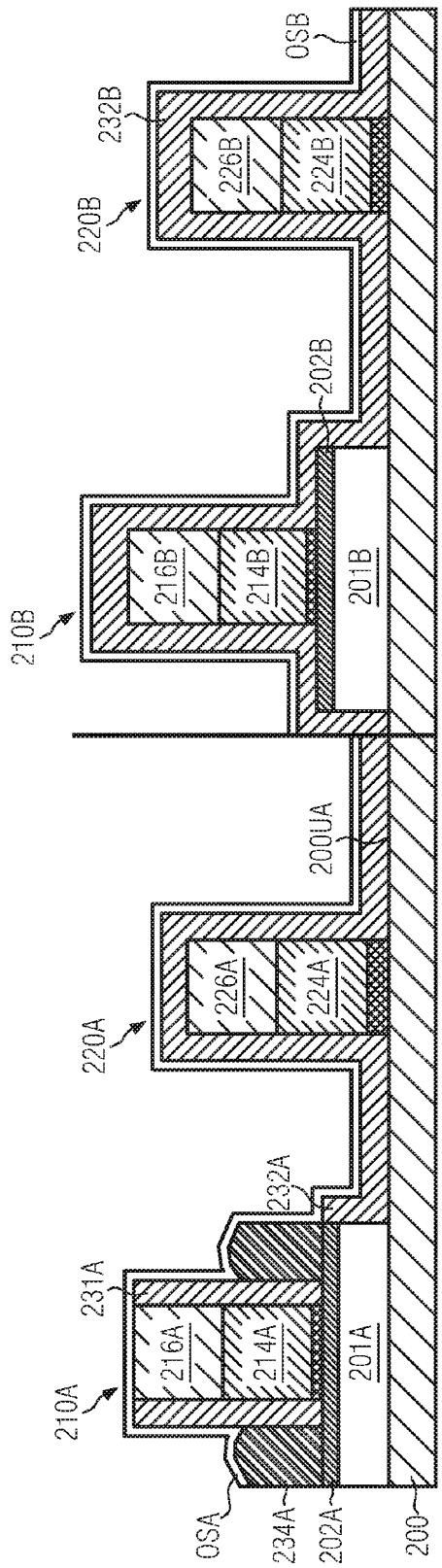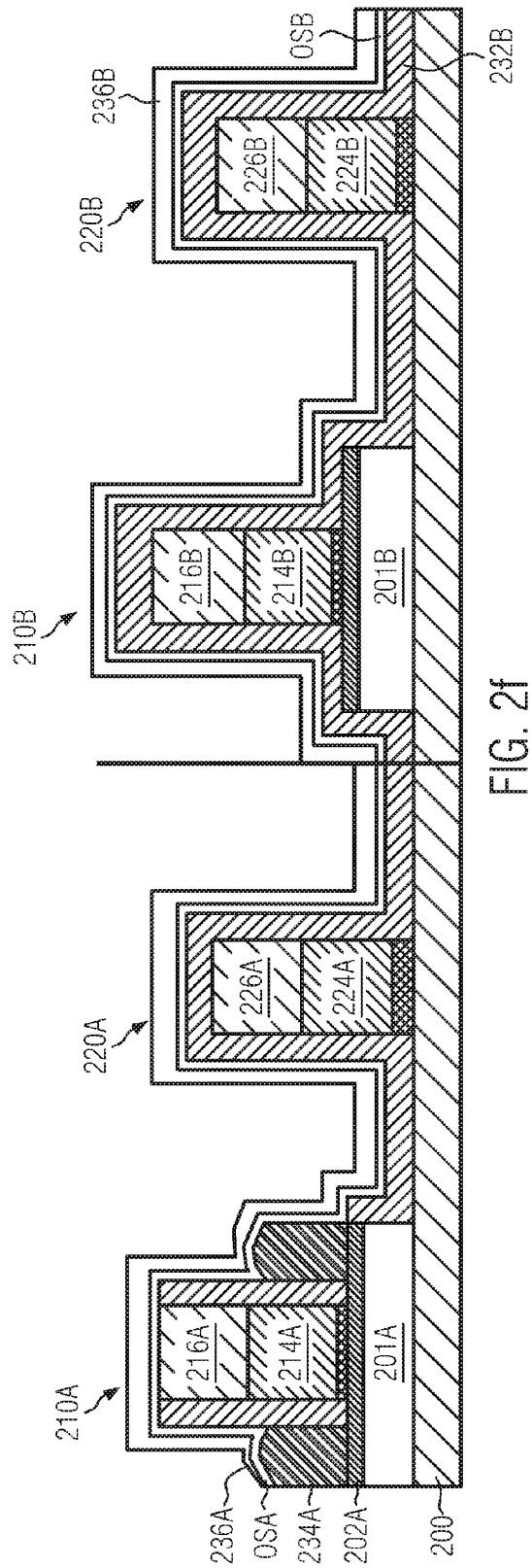

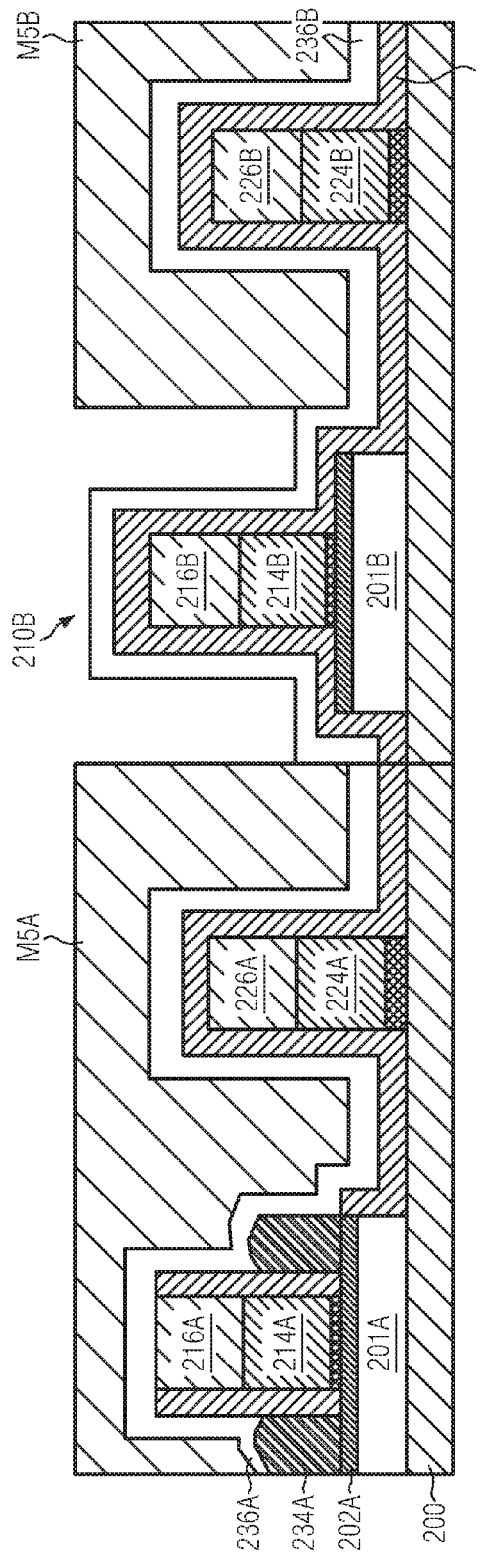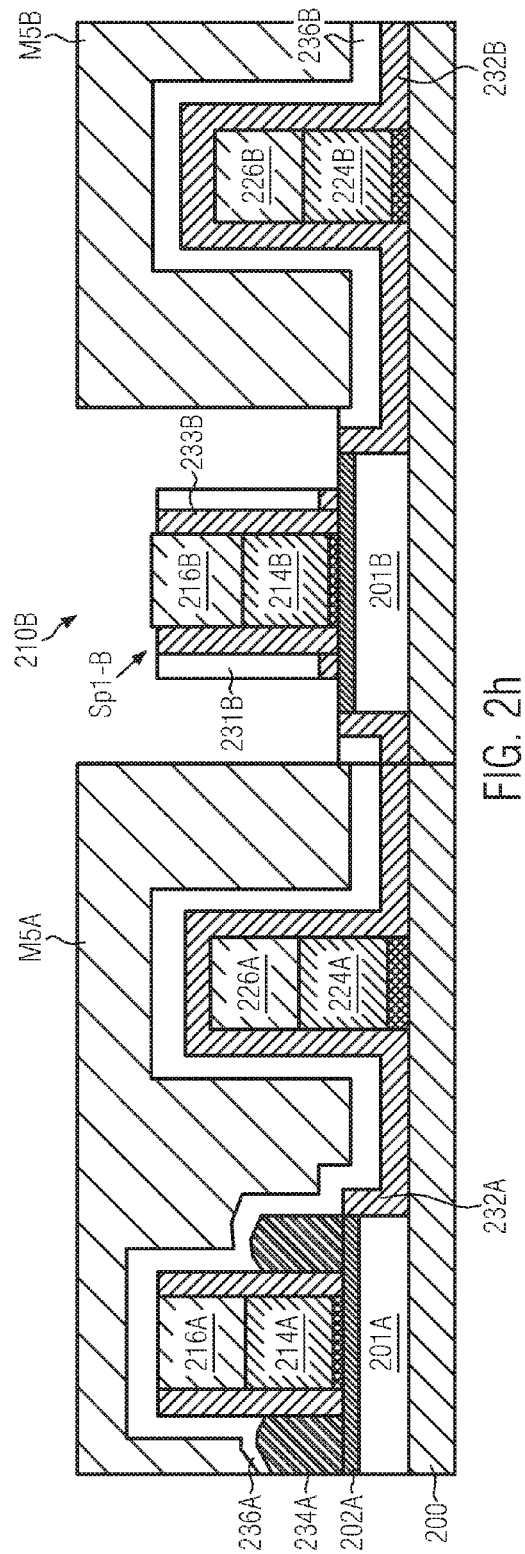

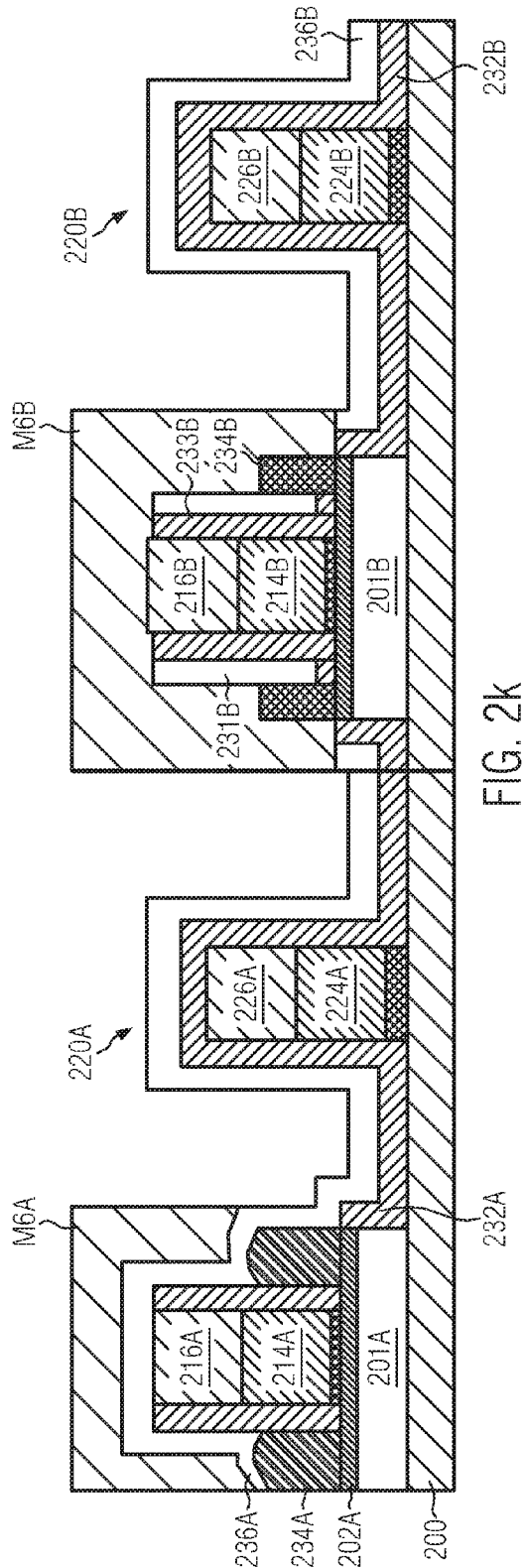
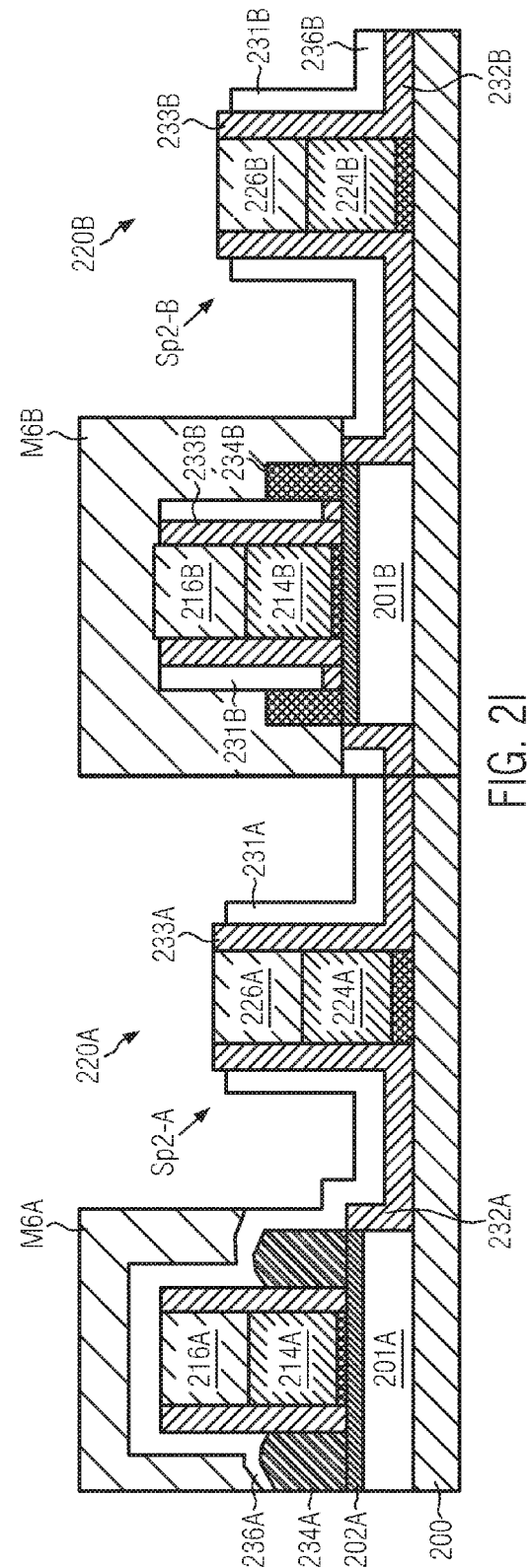

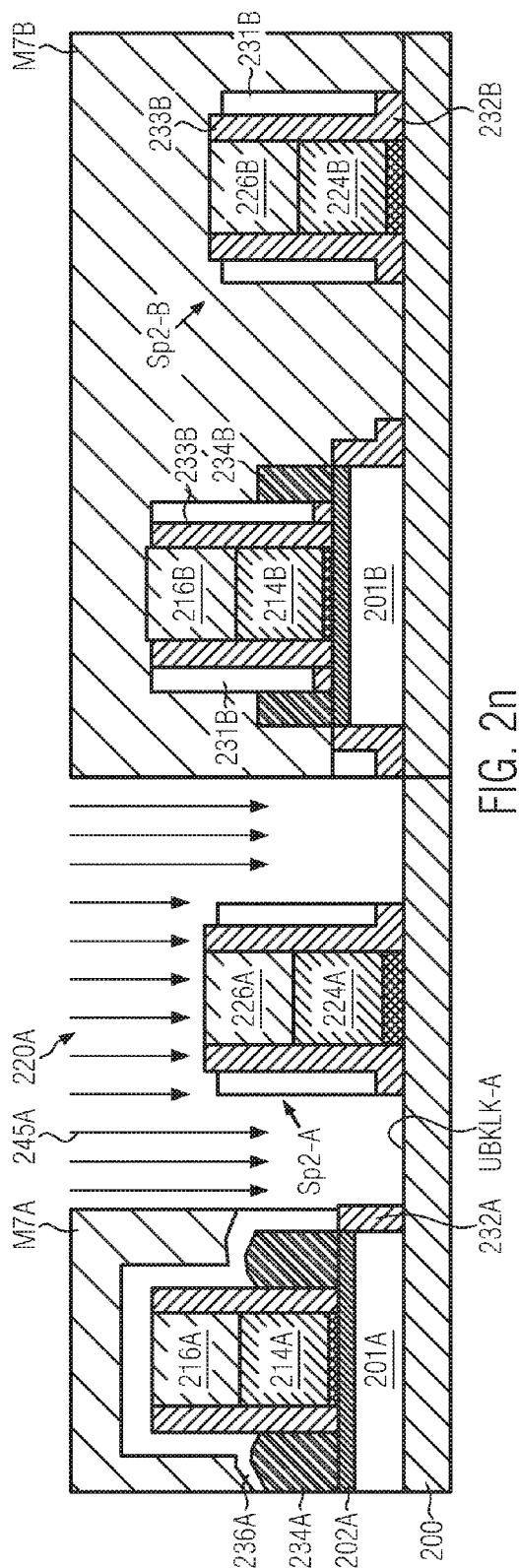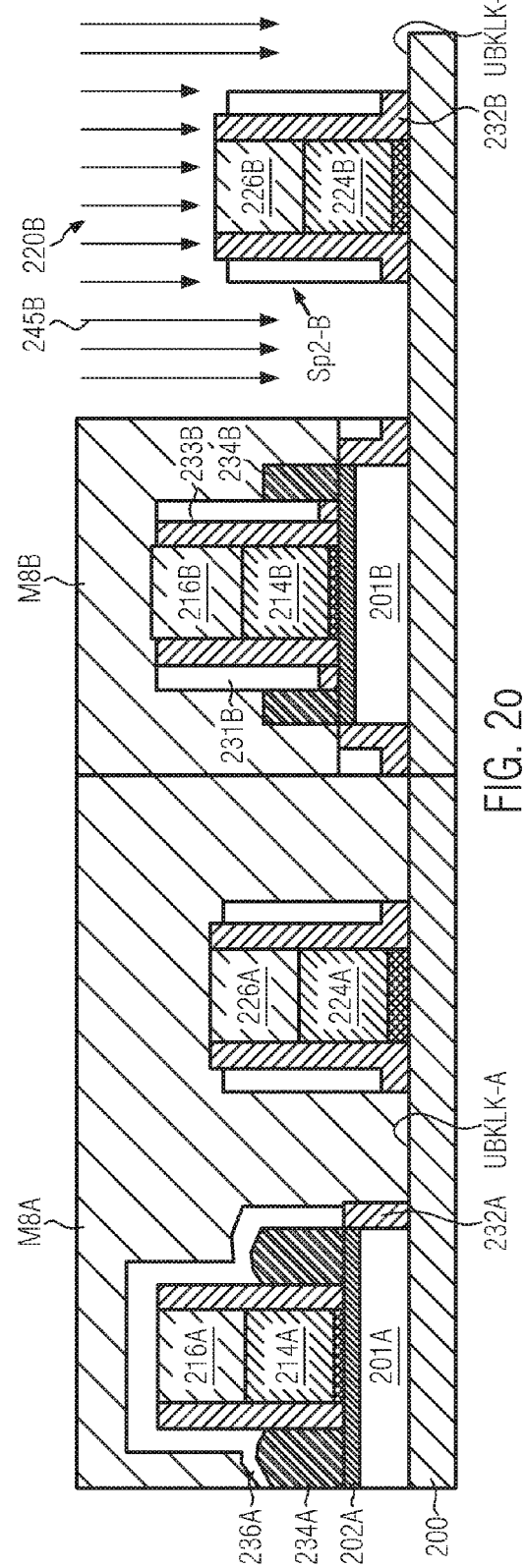

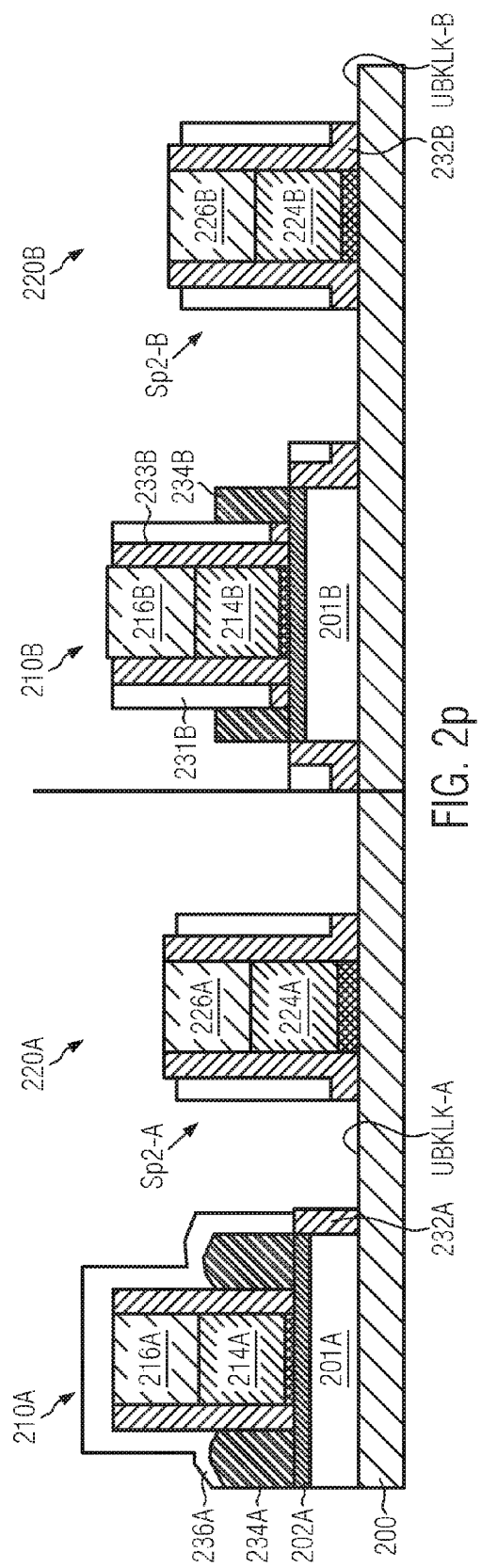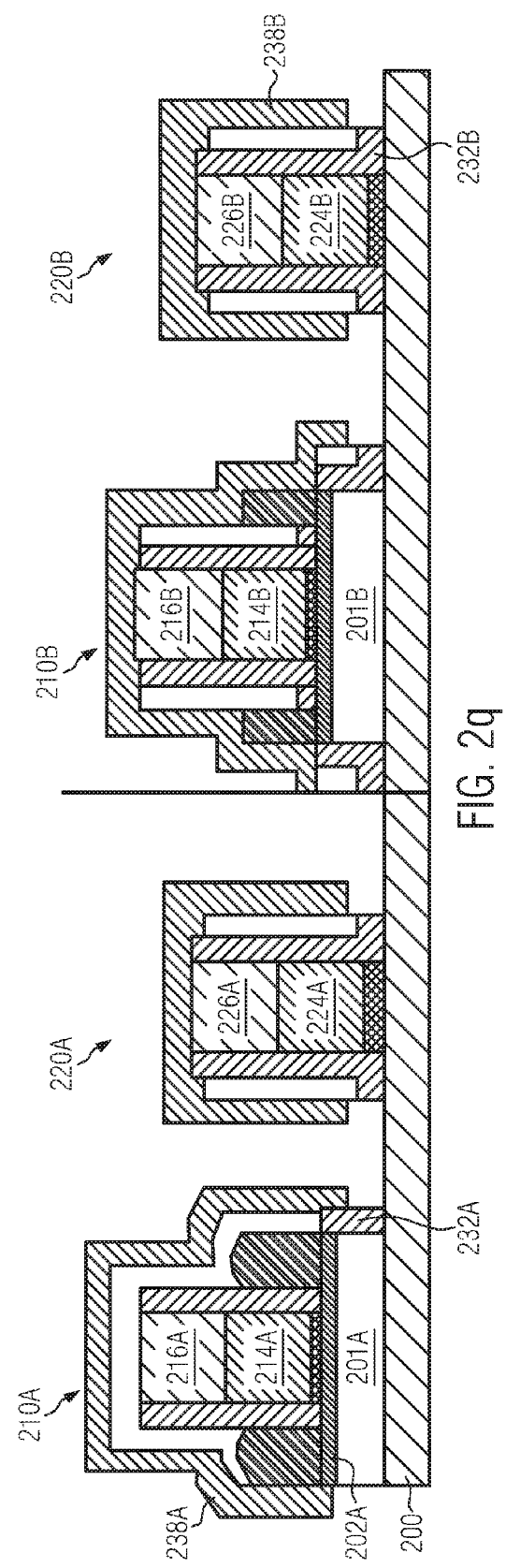

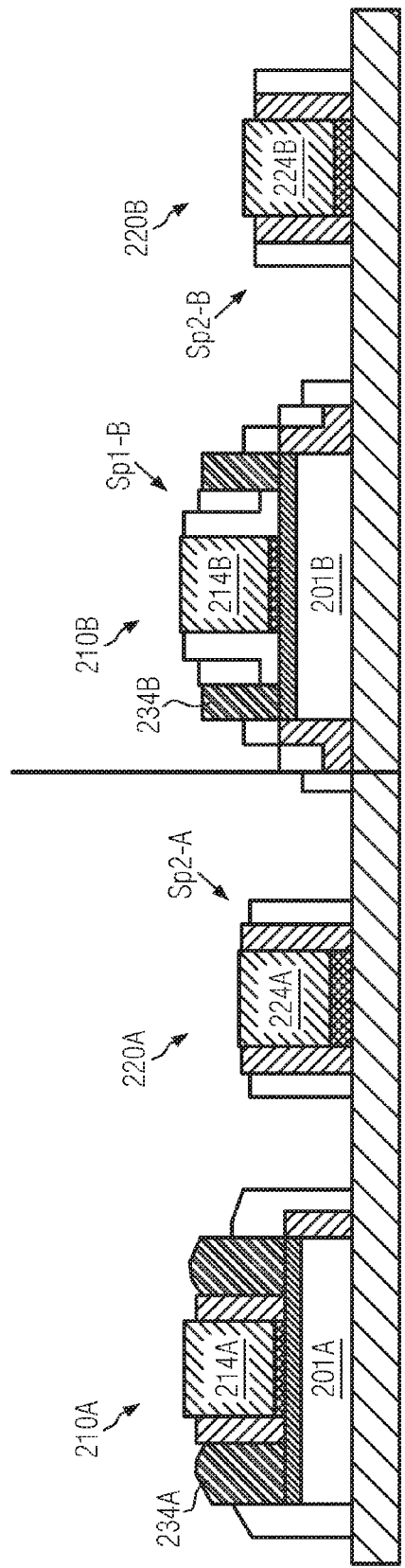
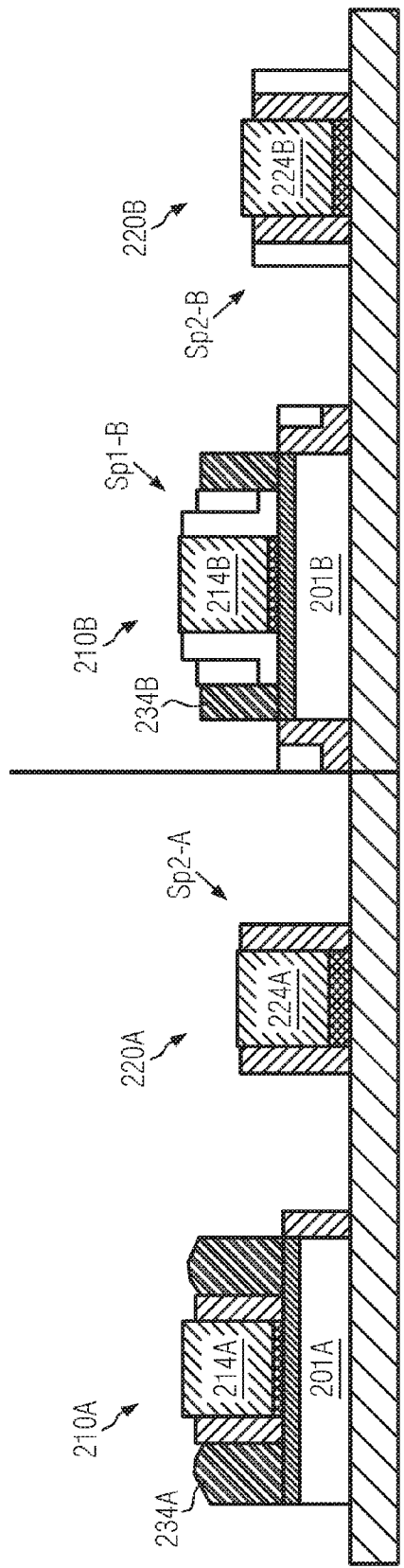

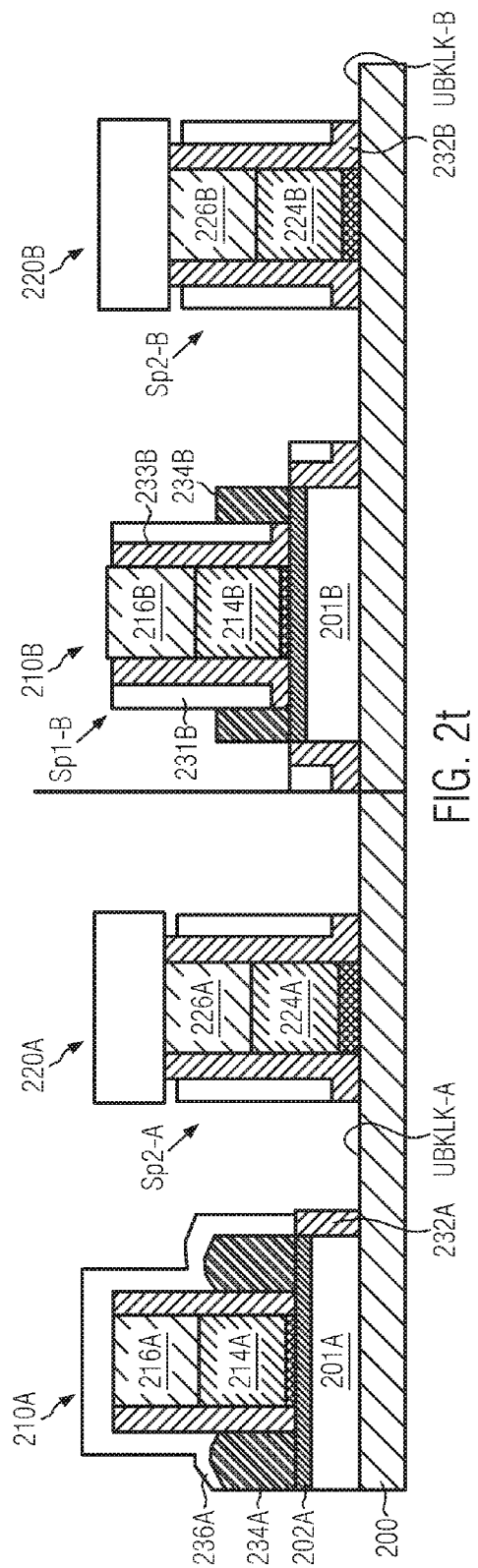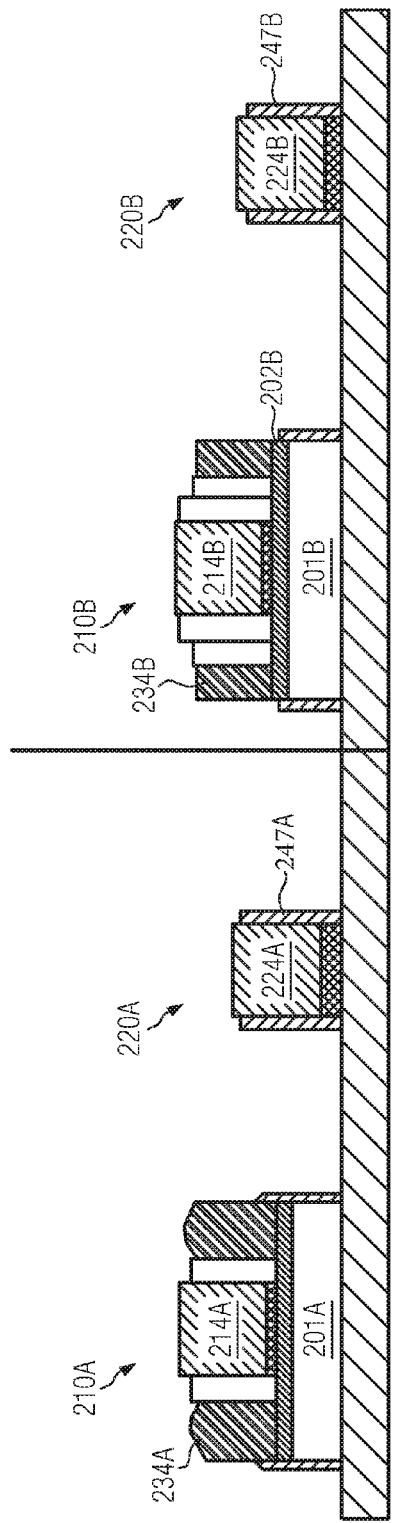
FIG. 2t
FIG. 2u

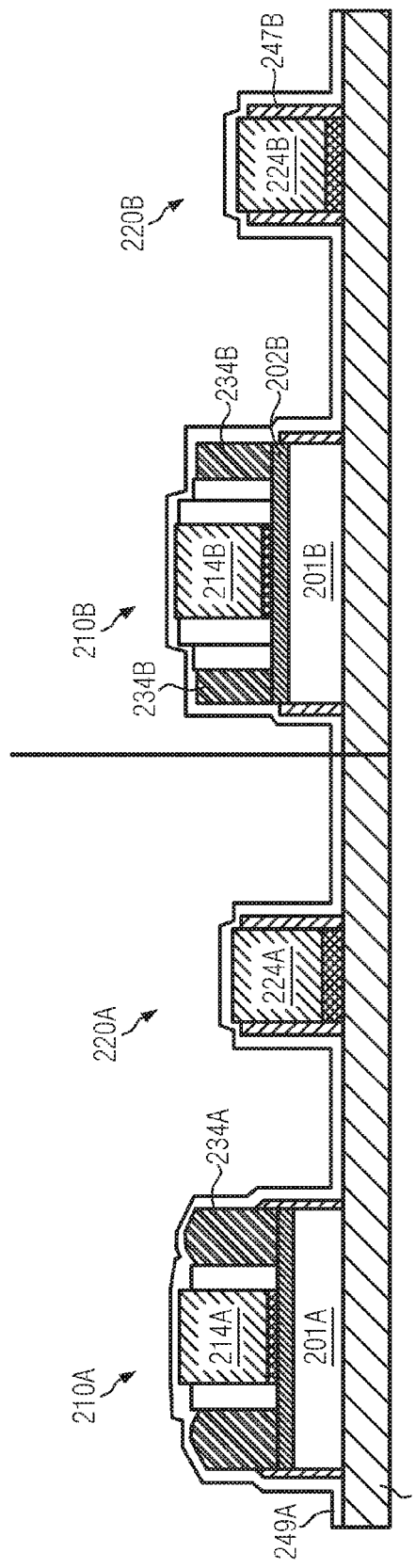
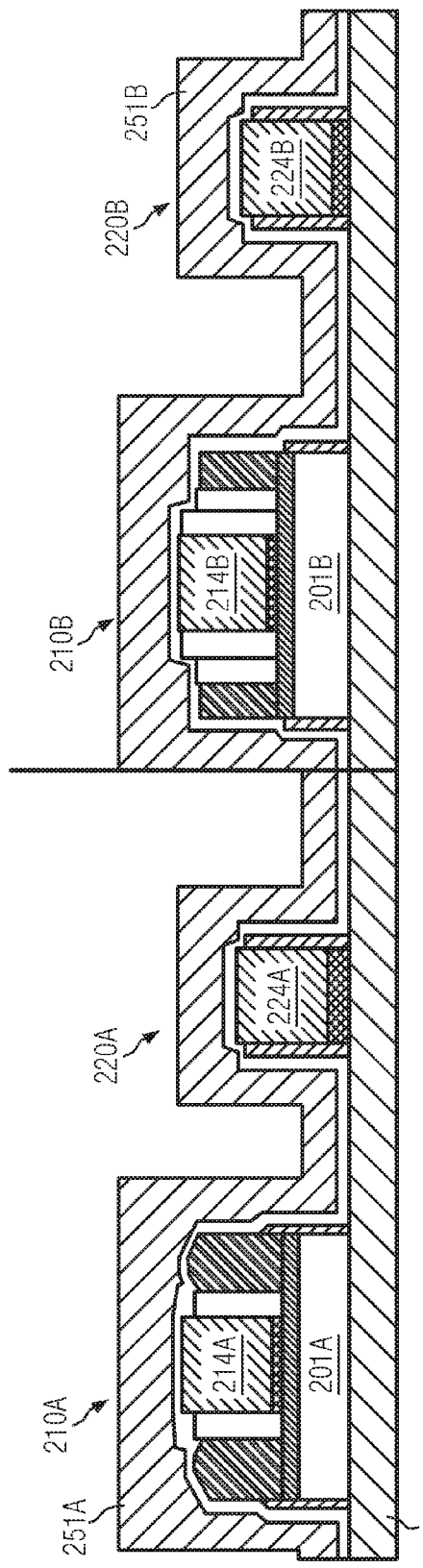

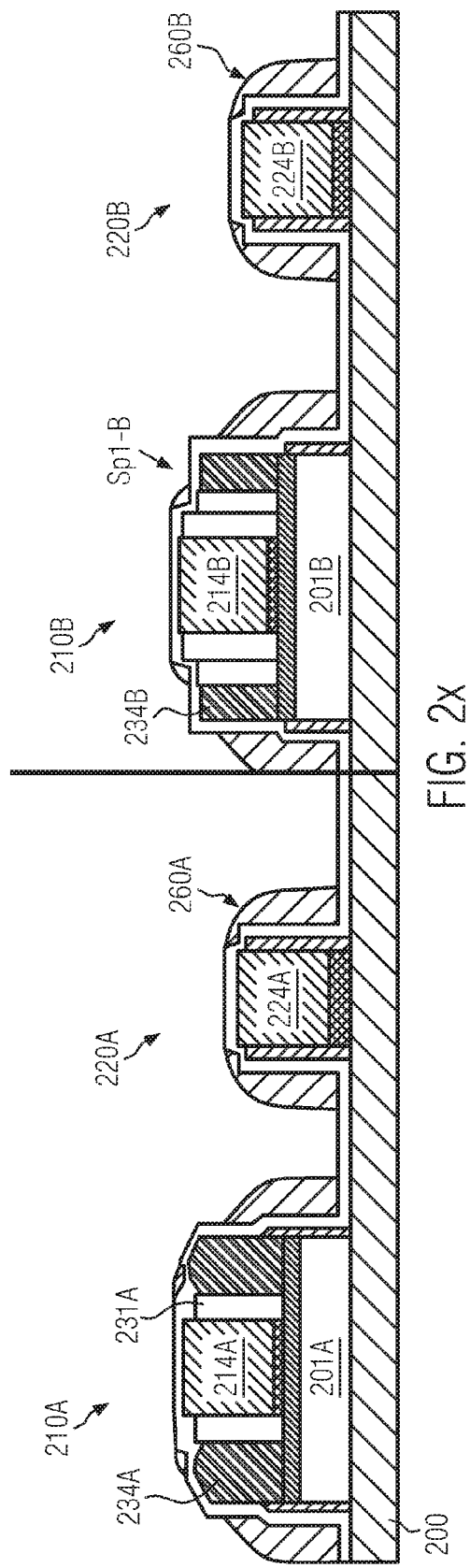

METHOD OF FORMING A SEMICONDUCTOR DEVICE STRUCTURE USING DIFFERING SPACER WIDTHS AND THE RESULTING SEMICONDUCTOR DEVICE STRUCTURE

BACKGROUND

1. Field of the Disclosure

The present disclosure generally relates to methods of forming semiconductor device structures and semiconductor device structures, and, more particularly, to the fabrication of semiconductor device structures for higher voltage I/O applications and according semiconductor device structures used in higher voltage I/O applications.

2. Description of the Related Art

Efforts to integrate more and more semiconductor devices on a semiconductor chip, and, alternatively, to optimize power loss of integrated circuits, resulted in the fabrication of integrated circuits having circuit elements of critical dimensions reaching into the deep sub-micron regime, currently 22 nanometers and beyond. The downscaling of circuit elements, such as transistor elements, e.g., MOSFET devices, to advanced scales raised constraints and issues to be dealt with, such as short channel effects, tunneling leakage, dielectric breakdown, etc. For example, the scaling of MOSFET devices poses an upper limit on the possible thickness of a gate dielectric at which reliable control of a channel region below a gate electrode is still maintained. With decreasing MOSFET size, the thickness of silicon dioxide used as a gate dielectric has decreased in order to increase the gate capacitance, and thereby the drive current, wherein the conductance of the channel region is, for example, modulated by the gate dielectric sustaining a sufficient high electric field transverse to the channel, the electric field normally being in a range from 1-5 MV/cm. On the other hand, the scaling of the thickness of a gate dielectric to smaller thickness values imposes constraints on the allowed magnitude of the electric field, bounded by a value at which electric breakdown (that is, rapid reduction in the resistance) of the gate dielectric occurs. On the one hand, the permissible voltage applied to a gate electrode depends on the thickness of a gate dielectric separating channel and gate. On the other hand, voltage values encountered in certain applications set constraints on the thickness of the dielectric, among others.

Conventionally, transistor devices are distinguished regarding the thickness of the gate dielectric as follows: devices having a thin gate dielectric (e.g., a thickness up to about 20 Å, such as having a thickness of about 10 Å) are referred to as "SG devices," devices having a normal gate dielectric (e.g., a thickness in a range from about 20-50 Å, such as having a thickness of about 35 Å) are referred to as "EG devices," and devices having a relatively thick gate dielectric (e.g., a thickness in a range from about 50 Å on, such as having a thickness of about 66 Å) are referred to as "ZG devices." The permissible voltage values, in which these devices may be operated, are as follows: SG devices may be operated between 0.6-1.2 V, EG devices may be operated in a range from about 1.2-1.8 V, and ZG devices may be operated above 1.8 V, commonly at 2.5 V and 3.3 V.

For example, SG devices, EG devices and ZG devices are used in I/O applications as I/O devices controlling the I/O voltage at I/O interfaces. For example, most current DDR SDRAM devices operate at a voltage of 2.5 volt, as compared to 3.3 volt for SDRAM, and thus, DDR SDRAM significantly reduces the power consumption over SDRAM.

In further current variations of DDR SDRAM, the operating voltage is reduced from 2.5/2.6 V for DDR SDRAM, to 1.8 V for DDR2, to 1.5 V for DDR3, and even down to 1.05/1.2 V for DDR4. Accordingly, greater power efficiency has been achieved for DDR which is, for example, used as a memory in mobile devices.

From the initial discussion it becomes clear that, for example, newer devices cannot be expected as being compatible with legacy systems due to higher operating voltages used in legacy systems.

In view of the aforesaid, it is desirable to provide a semiconductor device structure that is compatible with different systems and/or that may be used as an interface between advanced computational systems and legacy systems. Furthermore, it is desirable to provide semiconductor device structures with co-integrated devices supporting different operating voltages.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a method of forming a semiconductor device structure is provided. In accordance with some illustrative embodiments herein, the method includes providing a first active region and a second active region in an upper surface portion of a substrate, the first and second active regions being laterally separated by at least one isolation structure, forming a first gate structure comprising a first gate dielectric in the first gate electrode material over the first active region, and a second gate structure comprising a second gate dielectric and a second gate electrode material over the second active region, wherein a thickness of the second gate dielectric is greater than a thickness of the first gate dielectric, and forming a first sidewall spacer structure to the first gate structure and a second sidewall spacer structure to the second gate structure, wherein a lateral thickness of the second sidewall spacer structure at the base of the second sidewall spacer structure is greater than a lateral thickness of the first sidewall spacer structure at the base of the first sidewall spacer structure.

In a second aspect of the present disclosure, a method of forming a semiconductor device structure is provided. In accordance with some illustrative embodiments herein, the method includes providing a first active region and a second active region in an upper surface portion of a substrate, the first and second active regions being laterally separated by at least one isolation structure, forming a first gate structure comprising a first gate dielectric and a first gate electrode material over the first active region, and a second gate structure comprising a second gate dielectric and a second gate electrode material over the second active region, wherein a thickness of the second gate dielectric is greater than a thickness of the first gate dielectric, and depositing a first sidewall spacer material over the first and second gate structures, forming a first mask over the second active region leaving the first active region exposed to further processing, anisotropically etching the first sidewall spacer material, wherein a first sidewall spacer is formed to the first gate structure and upper surface regions in the first active regions are exposed in alignment with the first mask and the first sidewall spacer, epitaxially growing raised source/drain regions in the exposed upper surface regions, removing the first mask, forming a first spacer structure to the second gate structure, forming a second mask over the first active region, leaving the second active region exposed to further processing, performing an implantation process for increasing a doping level in the second active region in alignment with the second gate structure and the first spacer structure, removing the second mask, and replacing the first spacer structure by a second spacer structure to the second gate structure.

In accordance with a third aspect of the present disclosure, a semiconductor device structure is provided. In accordance with some illustrative embodiments herein, the semiconductor device structure includes a first active region and a second active region provided in an upper surface portion of a substrate, the first and second active regions being laterally separated by at least one isolation structure, a first gate structure formed over the first active region, the first gate structure comprising a first gate dielectric and a first gate electrode material, a second gate structure formed over the second active region, the second gate structure comprising a second gate dielectric and a second gate electrode material, wherein a thickness of the second gate dielectric is greater than a thickness of the first gate dielectric, and a first sidewall spacer structure and a second sidewall spacer structure, the first sidewall spacer structure covering sidewalls of the first gate structure and the second sidewall spacer structure covering sidewalls of the second gate structure, wherein a lateral thickness of the second sidewall spacer structure at the base of the second sidewall spacer structure is greater than a lateral thickness of the first sidewall spacer structure at the base of the first sidewall spacer structure.

BRIEF DESCRIPTION OF THE DRAWINGS

The disclosure may be understood by reference to the following description taken in conjunction with the accompanying drawings, in which like reference numerals identify like elements, and in which.

Figure 1G:
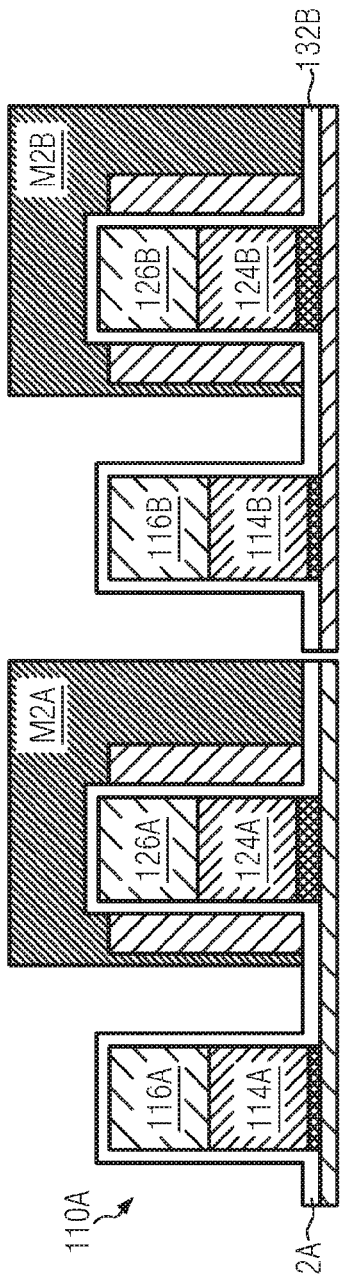
FIGS. 1a-1v schematically illustrate, in cross-sectional views, a fabrication process of forming a semiconductor device structure in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase. For example, the person skilled in the art will appreciate after a complete reading of the present disclosure that the expression "A over B" is not limited to the understanding that A is directly disposed on B, i.e., A and B being in physical contact.

The present disclosure shows, in accordance with some illustrative embodiments of the present disclosure, the fabrication of semiconductor device structures, such as a plurality of MOSFET or MOS devices integrated on a chip. When referring to MOS devices, the person skilled in the art will appreciate that, although the expression "MOS device" is used, no limitation to a metal-containing gate material and/or to an oxide-containing gate dielectric material is intended. Accordingly, a semiconductor device structure may be understood as comprising at least two MOS devices of at least one of a P-type and an N-type.

Semiconductor devices of the present disclosure may concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. After a complete reading of the present application, a person skilled in the art will appreciate that, according to the present disclosure, ground rules smaller or equal to 45 nm, e.g., at 22 nm or below, may be imposed. The present disclosure proposes semiconductor devices that may have structures of minimal length dimensions and/or width dimensions smaller than 100 nm, for example, smaller than 50 nm or smaller than 35 nm or smaller than 22 nm. For example, the present disclosure may provide semiconductor devices fabricated by using 45 nm technologies or below, e.g., 22 nm or even below.

The semiconductor devices disclosed herein may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best character-istics of each device type as they best suit the semiconductor device under design.

Furthermore, semiconductor devices as disclosed herein may be formed as bulk devices and/or SOI (silicon-on-insulator) devices. The expression SOI is not intended as being limited to silicon-on-insulator devices, but, in general, SOI devices as disclosed herein have an active semiconductor layer disposed on a buried insulating material layer, which, in turn, is formed on a base substrate material. In accordance with some illustrative embodiments herein, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like.

In accordance with herein disclosed illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 3-10 nm.

As to a crystalline plane orientation of the base substrate material, similar to that of an ordinary silicon device, an SOI substrate having a surface with a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. In alternative embodiments, the base substrate material may be of an N-type when N-accumulation and/or N-inversion devices are considered (otherwise P-type for P-accumulation and/or P-inversion).

After a complete reading of the present disclosure, the person skilled in the art will appreciate that the expression "semiconductor device structure" as used throughout the description relates to at least a first semiconductor device comprising a first gate structure formed over a first active region of a substrate, and a second semiconductor device comprising a second gate structure formed over a second active region of the substrate. Furthermore, the person skilled in the art will appreciate that a semiconductor device structure may comprise at least two adjoining semiconductor devices or, alternatively, at least two semiconductor devices of a semiconductor device structure may be laterally separated by at least one isolation structure, such as a shallow trench isolation and the like formed in the substrate.

In accordance with some illustrative embodiments of present disclosure, at least one of the semiconductor devices of a semiconductor device structure described below may be formed by one of an SG, EG and ZG device, and at least one further semiconductor device comprising one of an SG, EG and ZG device. For example, a semiconductor device structure in accordance with some illustrative embodiments of the present disclosure may comprise at least one SG device, e.g., requiring sidewall spacers of about a lateral thickness of 4 nm for optimized performance, with at least one ZG device, e.g., requiring sidewall spacers having a lateral thickness of about 10 nm. Accordingly, a co-integration of SG devices operating at 0.8 V and one of an EG device and a ZG device operating at 3.3 V may be performed in accordance with some illustrative embodiments of the present disclosure. As used herein and in the claims, when reference is made to a lateral thickness of a spacer or a spacer structure, it shall be understood to be a thickness of the spacer or spacer structure measured at the base or bottom of the spacer structure in a direction that is parallel to an upper surface of the substrate. i.e., in a direction that corresponds to the gate length direction of the transistor device.

With regard to FIGS. 1a-1v, some illustrative embodiments of the present disclosure will be explained in greater detail below.

FIG. 1a schematically illustrates, in a cross-sectional view, a semiconductor device structure comprising a first gate structure 110A formed over a first active region RX1A, and a second gate structure 120A formed over a second active region RX2A, wherein the first and second active regions RX1A, RX2A may be provided close to an upper surface USA of a substrate 100, including regions 100A and 100B at an early stage during fabrication. The substrate 100 may be a bulk substrate or an SOI substrate as indicated above. In case of an SOI configuration, the upper surface USA of the substrate 100 represents an upper surface of an active semiconductor layer formed on a buried insulating material layer (not illustrated), which is disposed on a semiconductor substrate material (not shown).

The person skilled in the art will appreciate that, although it is not illustrated in FIGS. 1a-1v, the first and second active regions RX1A and RX2A may be separated by at least one insulation structure (not illustrated), such as a shallow trench isolation (STI), which is omitted from the figures for not obscuring the present disclosure. The upper surface USA comprising the first and second active regions RX1A and RX2A may be a region where the substrate 100 is configured for implementing semiconductor devices of the N-type, such as NMOS devices and according (optional) well regions (not illustrated) may be formed in the surface region USA. Alternatively, the substrate 100 may be undoped or prepared for accommodating P-type devices in the surface region USA.

In accordance with some illustrative embodiments herein, the substrate 100 may further comprise a third active region RX1B and a fourth active region RX2B provided in an upper surface USB of the semiconductor substrate, the third and fourth active regions RX1B and RX2B possibly being separated from the first and second active regions RX1B and RX2A by at least one isolation structure (not illustrated), such as at least one STI formed in between, separating the surface regions USA and USB. The third and fourth active regions RX1B and RX2B may be laterally separated from each other by at least one insulation structure (not illustrated), e.g., one or more STIs. Over the third active region, RX1B, a third gate structure 110B is provided, while over the fourth active region RX2B, there is a fourth gate structure 120B provided.

The person skilled in the art will appreciate that the upper surface USB comprising the third and fourth active regions RX1B and RX2B may be a region where the substrate 100 is configured for implementing semiconductor devices of the P-type, such as PMOS devices and according (optional) well regions (not illustrated) may be formed in the surface region USB. Alternatively, the substrate 100 may be undoped or prepared for accommodating P-type devices in the surface region USB.

As illustrated in FIG. 1a, each of the gate structures 110A, 120A, 110B, 120B comprises a respective gate dielectric 112A, 122A, 112B, and 122B, a respective gate electrode material 114A, 124A, 114B and 124B, and a respective gate cap 116A, 126A, 116B and 126B. In accordance with some illustrative embodiments of the present disclosure, a thickness of the gate dielectric 112A may be smaller than a thickness of at least one of the gate dielectrics 122A and 122B. Additionally or alternatively, a thickness of the gate dielectric 112B may be smaller than at least one of the gate dielectrics 122A and 122B. However, this does not pose any limitation on the present disclosure and thicknesses of the gate dielectrics 112A, 122A, 112B and 122B may be about equal.

In accordance with some illustrative embodiments of the present disclosure, the gate dielectrics 112A, 122A, 112B and 122B may comprise at least one of an oxide material, e.g., silicon oxide, a high-k material, e.g., hafnium oxide, hafnium oxynitride, and the like, and optionally a work function adjusting material. Each of the gate electrode materials 114A, 124A, 114B and 124B may be formed by one of a gate metal, amorphous silicon and polysilicon. Each of the gate caps 116A, 126A, 116B and 126B may be formed by one of an oxide material, e.g., silicon oxide, and a nitride material, e.g., silicon nitride.

FIG. 1b schematically illustrates the semiconductor device structure in accordance with some illustrative embodiments of the present disclosure in a more advanced stage during fabrication, after an insulating material layer 132A is deposited over the first and second active regions RX1A and RX2A, and an insulating material layer 132B is deposited over the third and fourth active regions RX1B and RX2B. In accordance with some illustrative embodiments of the present disclosure, the insulating material layers 132A and 132B may comprise an oxide material, e.g., silicon oxide, and/or a nitrate material, e.g., silicon nitride. In accordance with some special illustrative embodiments herein, the insulating material layers 132A and 132B may be formed by the same insulating material, such as silicon nitride. In accordance with some special illustrative examples, the insulating material layers 132A and 132B may have a thickness up to about 10 nm, e.g., about 4 nm.

FIG. 1c schematically illustrates the semiconductor device structure at a more advanced stage during fabrication, after an insulating material layer 134A is formed over the first and second active regions RX1A and RX2A, and after an insulating material layer 134B is formed over the third and fourth active regions RX1B and RX2B. In accordance with some illustrative embodiments of the present disclosure, the insulating material layers 134A and 134B may be formed by depositing an oxide material, e.g., silicon oxide, and/or a nitride material, e.g., silicon nitride. In accordance with some special illustrative examples herein, the insulating material layer 134A and the insulating material layer 134B are formed by the same material, such as silicon oxide, when simultaneously depositing the insulating material layers 134A, 134B or sequentially depositing the insulating material layers 134A, 134B. In accordance with special illustrative examples herein, a thickness of the insulating material layers 134A and 134B may be up to 20 nm, e.g., in a range from about 5-15 nm, such as the thickness may be equal to about 10 nm.

FIG. 1d schematically illustrates the semiconductor device structure at a more advanced stage during fabrication, after forming a mask M1A over the first active region RX1A, wherein the first active region RX1A is covered and the second active region RX2A is exposed to further processing. In accordance with some special illustrative examples of the present disclosure, a mask M1B may be formed over the third active region RX1B covering the third active region RX1B and leaving the fourth active region RX2B exposed to further processing. The person skilled in the art will appreciate that the masks M1A, M1B may be formed in accordance with known masking and hardmasking techniques, respectively.

FIG. 1e schematically illustrates the semiconductor device structure at a more advanced stage during fabrication, according to which an etching process may be performed so as to etch the exposed insulating material layer 134A over the second active region RX2A and the insulating material layer 134B over the fourth active region RX2B. Herein, the insulating material layer 134A may be anisotropically etched.

In accordance with the illustration in FIG. 1e, a sidewall spacer 135A may be formed over sidewalls of the gate structure 120A over the second active region RX2A. In accordance with some illustrative examples, the sidewall spacer 135A may substantially have a lateral thickness at its base of about the thickness of the insulating material layer 134A. The person skilled in the art will appreciate that, upon depositing the insulating material layer 134A to a desired thickness, the lateral thickness of the spacer 135A may be about the desired thickness.

In accordance with the illustration in FIG. 1e, a sidewall spacer 135B may be formed over sidewalls of the gate structure 120B over the fourth active region RX2B. In accordance with some illustrative examples, the sidewall spacer 135B may substantially have a lateral thickness at its base of about the thickness of the insulating material layer 134B. The person skilled in the art will appreciate that, upon depositing the insulating material layer 134B to a desired thickness, the lateral thickness of the spacer 135B may be about the desired thickness.

The person skilled in the art will appreciate that, due to the anisotropic etching process as illustrated in FIG. 1e, the insulating material layers 132A and 132B may be exposed in alignment with the masks M1A, M1B and the gate structures 120A, 120B, including the respective spacers 135A, 135B.

Figure if schematically illustrates the semiconductor device structure at a more advanced stage during fabrication, after the masks M1A, M1B are removed and after masks M2A, M2B are formed. The mask M2A may be formed over the second active region RX2A, covering the second active region RX2A and leaving the first active region RX1A exposed to further processing. Furthermore, the mask M2B may be formed over the fourth active region RX2B, covering the fourth active region RX2B and leaving the third active region RX1B exposed to further processing.

FIG. 1g schematically illustrates the semiconductor device structure at a more advanced stage during fabrication, after an etching process is performed, wherein the insulating material layer 134A over the first active region RX1A may be removed. Furthermore, in the etching process, the insulating material layer 134B may be removed over the third active region RX1B. The person skilled in the art will appreciate that the etching process may comprise an etching process configured to remove the insulating material layer 134A, 134B selective to the masks M2A, M2B and the insulating material layer 132A, 132B. For example, the insulating material layers 132A, 132B may be end points for the etching process. Alternatively, a time-controlled etching process may be employed.

Figure 1H:
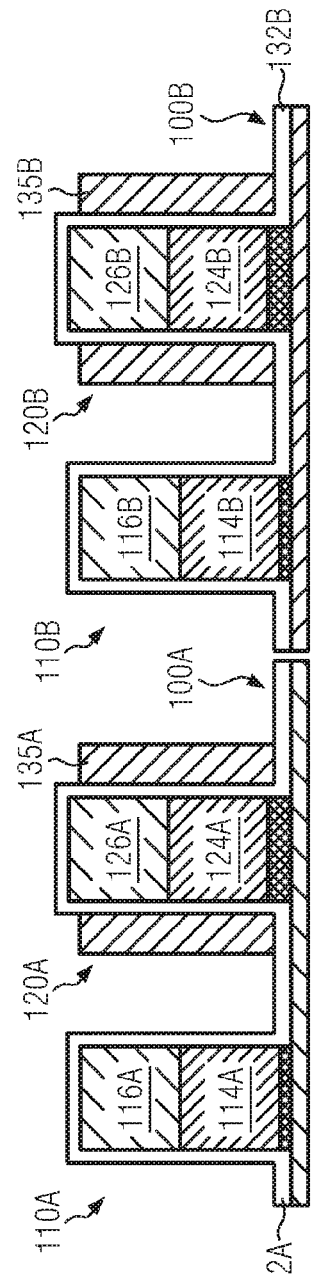

FIG. 1h schematically illustrates the semiconductor device structure at a more advanced stage during fabrication. In accordance with some illustrative embodiments herein, the masks M2A, M2B may be removed from above the second and fourth active regions RX2A, RX2B. Accordingly, the first, second, third, and fourth active regions RX1A, RX2A, RX1B, RX2B may be exposed to further processing.

After a complete reading of the disclosure, the person skilled in the art will appreciate that, at the stage as depicted in FIG. 1h, that is, after the removal of the masks M2A, M2B, the semiconductor device structure may be exposed to optional further processing (not illustrated), as follows: a mask pattern (not illustrated) may be formed over the semiconductor device, the mask pattern covering the second and/or third active region RX2A, RX2B, and leaving the first and/or third active regions RX1A, RX1B exposed; performing an implantation (not illustrated) for implanting dopants into the substrate 100 through the insulating material layer 132A and/or 132B; and removing the masking pattern (not illustrated). However, these optional process steps, which may be performed at the stage as illustrated in FIG. 1h, are optional and no limitation of the present disclosure is intended.

Figure 1I:
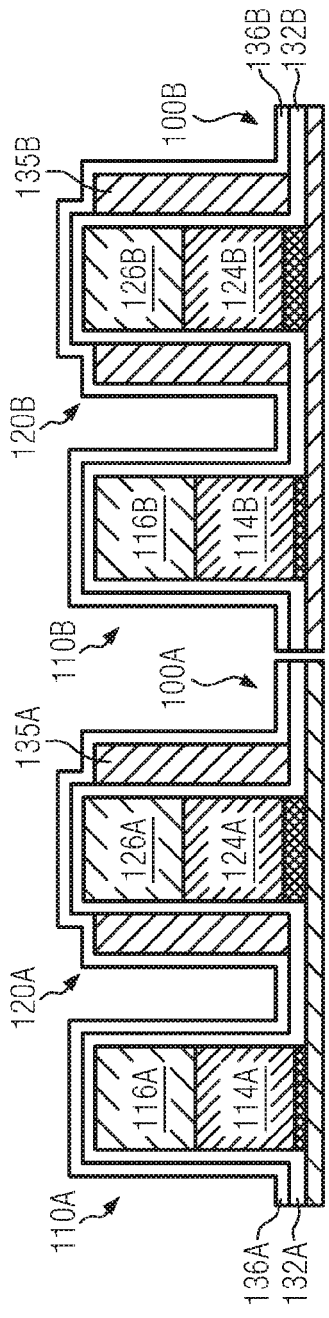

FIG. 1i schematically illustrates the semiconductor device structure at a more advanced stage during fabrication. In accordance with some illustrative embodiments herein, an insulating material layer 136A may be deposited over the first and second active regions RX1A, RX2A. Additionally or alternatively, an insulating material layer 136B may be deposited over the third and fourth active regions RX1B, RX2B. In accordance with some illustrative embodiments herein, the insulating material layers 136A and 136B may be formed by the same material and/or may be simultaneously or sequentially deposited. In accordance with some special illustrative examples, the insulating material layer 136A and the insulating material layer 136B may each have a thickness of up to about 10 nm, such as about 4 nm. In accordance with some illustrative examples, the material of the insulating material layers 136A, 136B may be a nitride material, such as silicon nitride.

After a complete reading of the present disclosure, the person skilled in the art will understand that, in accordance with some illustrative embodiments of the present disclosure, the insulating material layer 132A may be formed as a first nitride spacer layer, the insulating material layer 136A may be formed as a second nitride spacer layer, the insulating material layer 132B may be formed as a third nitride spacer layer, and the insulating material layer 136B may be formed as a fourth nitride spacer layer. In accordance with some illustrative examples, the first to fourth nitride spacer layers may be sequentially formed. Alternatively, the first and third nitride spacer layers may be simultaneously formed, and/or the second and fourth nitride spacer layers may be simultaneously formed. Furthermore, the insulating material layer 135A may be formed as a first oxide spacer layer and the insulating material layer 135B may be formed as a second oxide spacer layer. Herein, the first and second oxide spacer layers may be simultaneously or sequentially formed.

In accordance with some illustrative embodiments as described above, a thickness of the second oxide spacer layer may be greater than a thickness of the first oxide spacer layer or vice versa. This does not pose any limitation on the present invention and a thickness of the first and second oxide spacer layers may be substantially equal.

FIG. 1j schematically illustrates the semiconductor device structure at a more advanced stage during fabrication. In accordance with some illustrative embodiments, a mask M3B may be formed over the third and fourth active regions RX1B, RX2B, covering the third and fourth active regions RX1B and RX2B and leaving the first and second active regions RX1A, RX2A exposed to further processing. In accordance with some illustrative embodiments of the present disclosure, the mask M3B may be formed by known mask and hardmask techniques, respectively.

FIG. 1k schematically illustrates the semiconductor device structure at a more advanced stage during fabrication. In accordance with some illustrative embodiments, an anisotropic etching process may be applied to the first and second active regions RX1A, RX2A in alignment with the mask M3B. As a result, the insulating material layers 132A and 136A may be anisotropically etched relative to the mask M3B and the gate caps 116A and 126A. Accordingly, a sidewall spacer structure may be formed to the first gate structure 110A, and a sidewall spacer structure may be formed to the second gate structure 120A. In accordance with some illustrative embodiments, the sidewall spacer structure to the first gate structure 110A may comprise sidewall spacers 133A and 137A covering sidewalls of the first gate structure 110A. In accordance with some illustrative embodiments, the sidewall spacer structure to the second gate structure 120A may comprise sidewall spacers 133B, 135A and 137B. After a complete reading of the present disclosure, the person skilled in the art will appreciate that a lateral thickness of the sidewall spacer structure adjacent to the second gate structure 120A may be adjusted by means of the sidewall spacer 135A being greater than the sidewall spacer structure adjacent to the first gate structure 110A. Accordingly, the second gate structure 120A having the gate dielectric 122A of greater thickness relative to the gate dielectric 112A of the first gate structure 110A may have a sidewall spacer structure of greater lateral thickness (at its base) when compared to the lateral thickness of the sidewall spacer structure (at its base) of the first gate structure 110A.

The person skilled in the art will appreciate that, at the presently described stage during fabrication, the upper surface USA of the substrate 100 may be exposed in the first and second active regions RX1A, RX2A in alignment with the first and second gate structures 110A, 120A and the sidewall spacer structures, and an optional implantation may be performed to increase a dopant density in the substrate 100 in alignment with the first and second gate structures 110A, 120A and the sidewall spacer structures after the etching process resulting in the sidewall spacer structures to the first and second gate structures 110A, 120A. However, this optional implantation is not posing any limitation on the present disclosure.

FIG. 1l schematically illustrates the semiconductor device at a more advanced stage during fabrication, after the mask M3B is removed from above the third and fourth active regions RX1B and RX2B. Accordingly, the insulating material layer 136B over the third and fourth active regions RX1B and RX2B may be exposed to further processing.

FIG. 1m schematically illustrates the semiconductor device structure at a more advanced stage during fabrication, after a precleaning process is performed. The person skilled in the art will appreciate that the third and fourth active regions RX1B and RX2B may be protected from deteriorating effects, possibly caused by the precleaning process, due to the insulating material layers 136B and 132B. The precleaning process may be performed for cleaning exposed surfaces USA of the substrate 100 in the first and second active regions RX1A, RX2A. The person skilled in the art will appreciate that the precleaning process may affect the sidewall spacer 135A such that the sidewall spacer 135A may be slightly etched back or trimmed, as it is indicated in FIG. 1m. However, this does not pose any limitation to the present disclosure. The preclean process may prepare exposed surfaces USA of the substrate 100 for a subsequent epitaxial growing process by removing contaminants, such as oxide material, oxygen and the like, from the surface USA of the substrate 100.

FIG. 1n schematically illustrates the semiconductor device structure at a more advanced stage during fabrication, after the epitaxial growth process is completed and epitaxially grown raised source/drain regions 141A are grown on the exposed upper surfaces USA (FIG. 1m) of the substrate 100 adjacent to the first and second gate structures 110A, 120A in the first and second active regions RX1A, RX2A. In accordance with some illustrative embodiments herein, the raised source/drain regions 141A may be formed by growing in situ doped material or by growing undoped material. In accordance with some illustrative examples, the raised source/drain regions 141A may be formed by growing a silicon material, a silicon carbon material, a silicon germanium material and the like, optionally doped or undoped.

FIG. 1o schematically illustrates the semiconductor device structure at a more advanced stage during fabrication, after an insulating material layer 143A is deposited over the first and second active regions RX1A, RX2A and an insulating material layer 143B is deposited over the third and fourth active regions RX1B, RX2B. In accordance with some illustrative embodiments, the insulating material layers 143A and 143B may be formed by the same insulating material. In accordance with some illustrative examples, at least one of the insulating materials 143A and 143B may be formed by a nitride material, e.g., silicon nitride. In accordance with some illustrative embodiments, a thickness of the insulating material layers 143A and 143B may be about equal. In accordance with some illustrative embodiments, a thickness of the insulating material layers 143A and 143B may be in the range from about 3-15 nm, such as in a range from about 5-10 nm, e.g., the thickness may be about 6 nm.

FIG. 1p schematically illustrates the semiconductor device structure at a more advanced stage during fabrication, after a mask M3A is formed over the first and second active regions RX1A, RX2A, the mask M3A covering the first and second active regions RX1A, RX2A and leaving the third and fourth active regions RX1B, RX2B exposed to further processing. The mask M3A may be formed in accordance with known masking and hardmasking techniques, respectively.

FIG. 1q schematically illustrates the semiconductor device structure at a more advanced stage during fabrication, after an anisotropic etching process is performed in alignment with the mask M3A. The anisotropic etching process may be applied to the insulating material layers 132B, 136B and 143B. The person skilled in the art will appreciate that the anisotropic etching process may comprise a sequence of etchings, wherein the individual insulating material layers 132B, 136B and 143B may be anisotropically etched relative to each other, possibly using the respective underlying insulating material layer as an etch stop material. Accordingly, sidewall spacers may be formed to the third gate structure 110B via the sidewall spacers 132C, 136C and 143C, while the gate cap 116B of the third gate structure 110B may be exposed. Furthermore, a sidewall spacer structure may be formed to the fourth gate structure 120B by means of sidewall spacers 132D, 136D, 135B, and 143D. The person skilled in the art will appreciate that a varying lateral thickness of the spacer structure to the fourth gate structure 120B relative to a lateral thickness of the spacer structure to the third gate structure 110B may be adjusted by means of the sidewall spacer 135B. Accordingly, a thicker sidewall spacer structure may be, for instance, formed to the fourth gate structure 120B as opposed to the third gate structure 110B via the additional sidewall spacer 135B.

FIG. 1r schematically illustrates the semiconductor device structure at a more advanced stage during fabrication, after the mask M3A is removed and the first and second active regions RX1A, RX2A are exposed to further processing. The person skilled in the art will appreciate that, at this stage during fabrication, the insulating material 143A overlies the first and second gate structures 110A, 120A and the raised source/drain regions 141A.

FIG. 1s schematically illustrates the semiconductor device structure at a more advanced stage during fabrication, after a precleaning process similar to the precleaning process as described above with regard to FIG. 1m is performed. Similarly, the insulating material layer 143A over the first and second active regions RX1A, RX2A may protect the first and second gate structures 110A, 120A and the raised source/drain regions 141A from any deteriorating effect caused by the precleaning process. Similarly, the additional spacing defining sidewall spacer 135B may be affected by the precleaning process as indicated by the back-etched sidewall spacer 135B. However, this does not pose any limitations to the present disclosure.

FIG. 1t schematically illustrates the semiconductor device structure at a more advanced stage during fabrication, after an epitaxial growth process is performed and raised source/drain regions 141B are grown on the third and fourth active regions RX1B, RX2B. In accordance with some illustrative embodiments herein, the raised source/drain regions 141B may be formed by growing in situ doped material or by growing undoped material. In accordance with some illustrative examples, the raised source/drain regions 141B may be formed by growing a silicon material, a silicon carbon material, a silicon germanium material and the like, optionally doped or undoped.

FIG. 1u schematically illustrates the semiconductor device structure at a more advanced stage during fabrication, after a dry gate cap removal is performed, wherein the gate caps 116A, 126A, 116B and 126B are removed. For example, the dry gate cap removal may comprise an etching and dry etching process for removing the insulating material 143A, and subsequently an anisotropic etching process for removing the gate cap layers 116A to 126B together with the sidewall spacer materials, wherein the sidewall spacer structures may be etched back to the level of the gate electrode materials 114A to 124B as indicated in FIG. 1u. Subsequently, an oxide layer 145A, 145B may be formed over the semiconductor device structure.

FIG. 1v schematically illustrates the semiconductor device structure at a more advanced stage during fabrication, after an oxide removal process for removing the oxide layers 145A, 145B is performed, wherein the sidewall spacers 135A, 135B may possibly be etched back. Accordingly, the device structures depicted in FIG. 1v may be obtained.

In accordance with some illustrative embodiments as described above with regard to FIGS. 1a-1v, a co-integration of gate structures having a thick gate dielectric as compared to other gate structures (i.e., gate structures 120A, 120B vs. 110A, 110B) may be performed.

In accordance with some illustrative embodiments as described above with regard to FIGS. 1a-1v, a thicker sidewall spacer structure to some gate structures (i.e., gate structures 120A, 120B) when compared to other gate structures (i.e., gate structures 110A, 110B) may be formed by a three-layered spacer structure, wherein the additional spacing may be defined via the intermediate or interposed sidewall spacer. In accordance with some illustrative examples, a nitride-oxide-nitride spacer may be formed, wherein the thickness of the spacer may be ultimately defined by the oxide spacer. This does not cause any limitation of the present disclosure and other spacer configurations, such as oxide-nitride-oxide, nitride-(low-k)-nitride and the like may be employed, where "(low-k)" denotes a low-k material, such as SiBCN, SiOCN, SiCN and the like.

In accordance with some illustrative embodiments, as described above with regard to FIGS. 1a-1v, two optional masked link-up implants may be employed to increase the doping level below the thicker sidewall spacer structure: an optional implant may be performed after removal of the second spacer forming material over the gate structures with a thinner gate dielectric, wherein the implantation is carried out through a thin insulating material layer, or, alternatively, after a spacer etch process took place and prior to the respective epitaxial growth processes for forming source/drain regions.

The person skilled in the art will appreciate that the illustrative embodiments as described above may allow for maintaining thin oxide IP and libraries in process flows, and to treat ZG devices as an option on the base platform.

In the illustrative embodiments as described above with regard to FIGS. 1a-1v, each of the first active region RX1A, second active region RX2A, third active region RX1B, and fourth active region RX2B may be configured according to one of an SOI type active region and a bulk type active region. Accordingly, the active regions may be either of bulk type, of SOI type, or of a hybrid/mixed type where at least one of the active regions is of an SOI type.

In accordance with some illustrative embodiments of the present disclosure as described above with regard to FIGS. 1d-1e, formation of masks M1A and M1B cover SOI regions SOI-A and SOI-B, and a subsequent etching applied to the exposed bulk regions BULK-A and BULK-B is disclosed. This is not limiting the present disclosure by any means and, after a complete reading of the present disclosure, the person skilled in the art will appreciate that a maskless spacer etching, e.g., a maskless oxide spacer etch, may be performed.

A further illustrative embodiment of the present disclosure will be described below with regard to FIGS. 2a-2x.

Figure 2A:
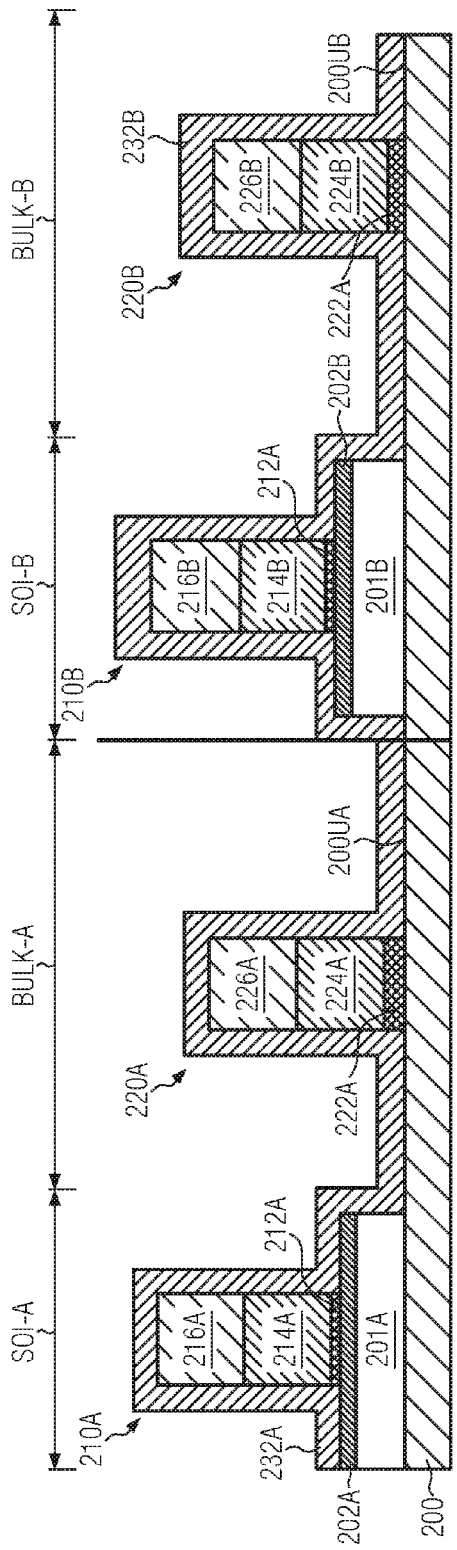
FIGS. 2a-2x schematically illustrate, in cross-sectional views, a fabrication process of forming a semiconductor device structure in accordance with other illustrative embodiments of the present disclosure.

FIG. 2a schematically illustrates a semiconductor device structure at an early stage during fabrication. Herein, a semiconductor substrate material 200 may be divided into multiple active regions, e.g., a first SOI region SOI-A, a first bulk region BULK-A, a second SOI region SOI-B and a second bulk region BULK-B. In each of the bulk regions, BULK-A and BULK-B, the semiconductor substrate material 200 may represent the substrate, wherein a gate structure 220A, including gate dielectric 222A, is provided on an upper surface 200UA in the first bulk region BULK-A. In the second bulk region BULK-B, a gate structure 220B, is formed on an upper surface 200UB of the substrate 200. In the first SOI region SOI-A, an SOI type substrate is provided, wherein an active semiconductor layer 202A is formed over the substrate 200, having a buried insulating material layer 201A interposed therebetween. A gate structure 210A, including gate dielectric 212A, is formed on the active semiconductor 202A. In the second SOI region SOI-B, an active semiconductor layer 202B is formed over the substrate 200, having a buried insulating material layer 201B interposed therebetween. A gate structure 210B is formed on the active semiconductor layer 202B in the second SOI region SOI-B.

At the stage illustrated in FIG. 2a, an insulating material layer 232A may be formed over the first SOI region SOI-A and the first bulk region BULK-A, and an insulating material layer 232B may be formed over the second SOI region SOI-B and the second bulk region BULK-B. In accordance with some illustrative embodiments of the present disclosure, the insulating material layer 232A and the insulating material layer 232B may be formed from the same material, e.g., a nitride material. In accordance with some special illustrative examples, a thickness of the insulating material layer 232A and the insulating material layer 232B may be in a range from about 3-15 nm, e.g., in a range from about 5-10 nm, such as about 8 nm.

Figure 2B:
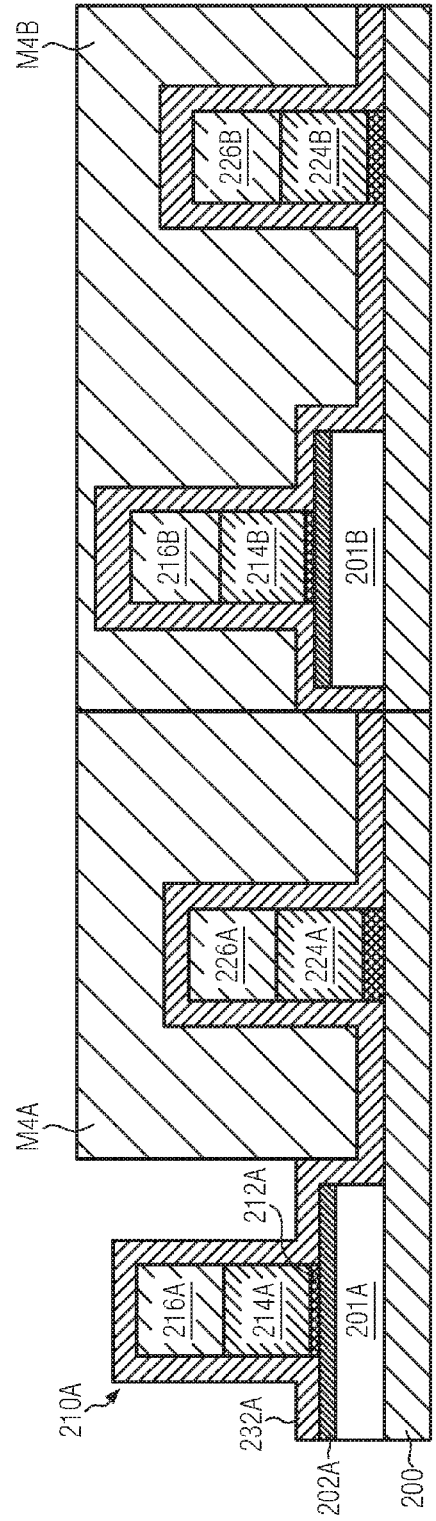

FIG. 2b schematically illustrates the semiconductor device structure at a more advanced stage during fabrication, after a mask M4A, M4B is formed over the first bulk region BULK-A, the second SOI region SOI-B, and the second bulk region BULK-B, the mask M4A covering the first bulk region BULK-A, the second SOI region SOI-B and the second bulk region BULK-B and leaving the first SOI region SOI-A exposed to further processing. The mask M4A may be formed in accordance with known masking and hard-masking techniques, respectively.

Figure 2C:
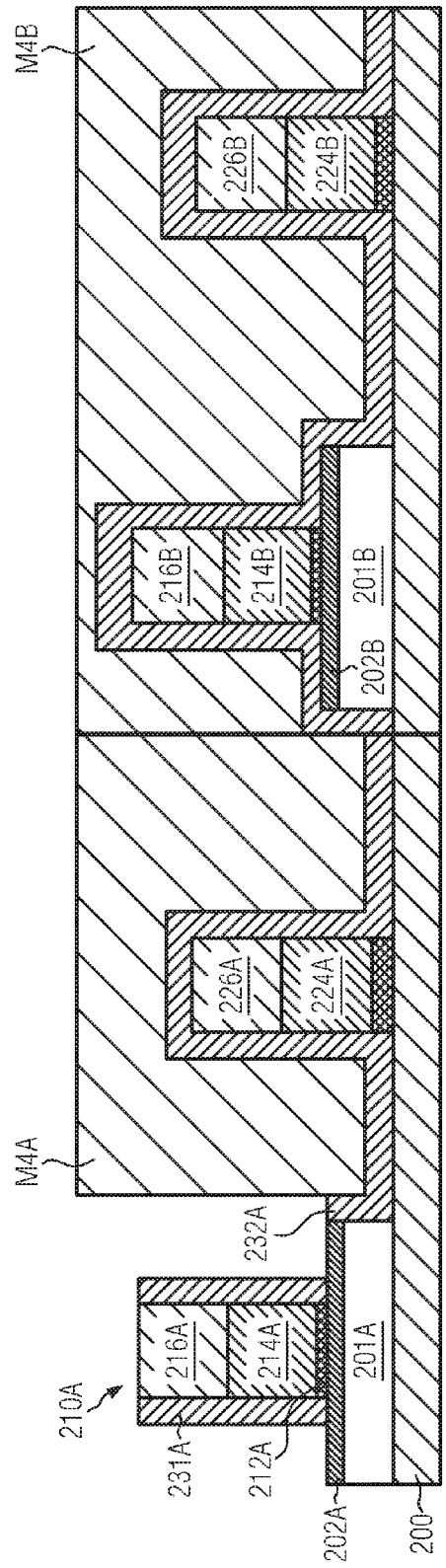

FIG. 2c schematically illustrates the semiconductor device structure at a more advanced stage during fabrication, after an anisoptropic etch process is performed. As illustrated in FIG. 2c, the anisotropic etch process may be applied to the first SOI region SOI-A, wherein the insulating material layer 232A in the first SOI region SOI-A is anisotropically etched. As a result, the sidewall spacer 231A is formed on the gate structure 210A.

Figure 2D:
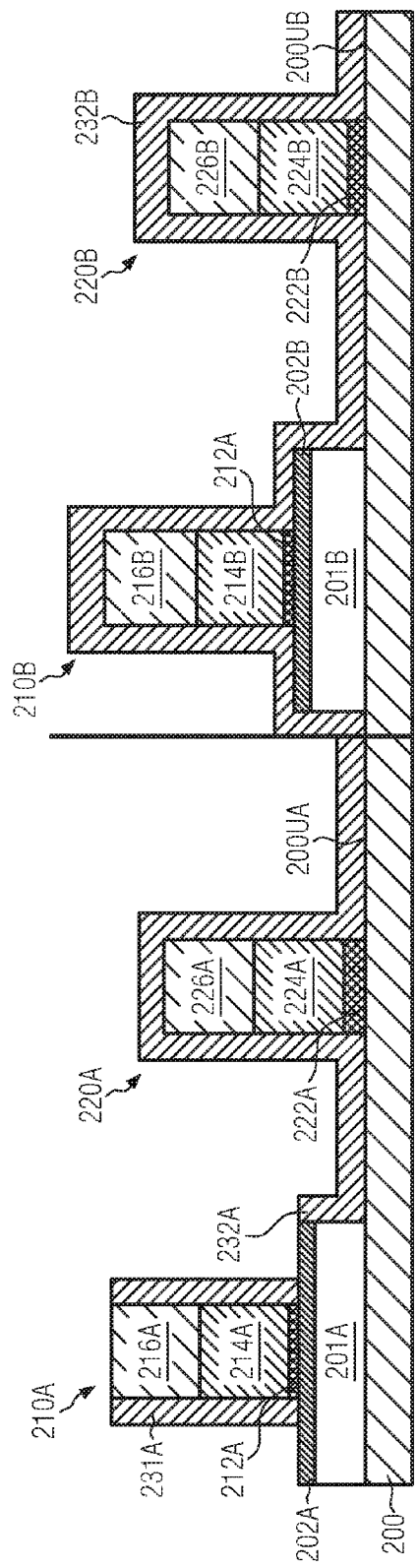

FIG. 2d schematically illustrates the semiconductor device structure at a more advanced stage during fabrication, after mask M4A (FIG. 2c) is removed in accordance with a mask removal process, e.g., a mask strip process. Accordingly, the semiconductor device structure as illustrated in FIG. 2d may have the gate structures 210A, 220A, 210B and 220B exposed to further processing.

Subsequently, an optional precleaning process may be performed in order to clean upper surfaces of the first SOI region SOI-A adjacent to the gate structure 210A in alignment with the sidewall spacer 231A. The person skilled in the art will appreciate that the substrate 200 in the first region BULK-A, the second SOI region SOI-B, and the second bulk region BULK-B may be protected via the insulating material layer 232A and the insulating material layer 232B. With regard to the precleaning process, reference is made to the description of FIG. 1n above.

FIG. 2e schematically illustrates a semiconductor device structure at a more advanced stage during fabrication, after an epitaxial growth process is performed and, optionally, insulating material layers OSA and OSB are formed over the substrate 200. In accordance with the epitaxial growth process, raised/source drain regions 234A may be grown adjacent to the gate structure 210A in alignment with the sidewall spacer 231A. That is, the sidewall spacer 231A may adjust a spacing between the gate electrode 214A and the raised source/drain regions 234A in the first SOI region SOI-A. The person skilled in the art will appreciate that, outside the first SOI region SOI-A, the substrate 200 may be protected from the epitaxial growth process via the insulating material layers 232A, 232B. Accordingly, raised source/drain regions may only be grown on the first SOI region SOI-A at this stage during fabrication. The raised source/drain regions 234A may be in situ doped during the epitaxial growing or may remain undoped. The person skilled in the art will appreciate that the raised source/drain regions 234A may be formed by growing a semiconductor material, such as silicon, silicon carbon or silicon germanium or the like.

Subsequently, the optional insulating material layer OSA may be formed over the SOI region SOI-A and the bulk region BULK-A, and the insulating material layer OSB may be formed over the SOI region SOI-B and the bulk region BULK-B. In accordance with some illustrative embodiments of the present disclosure, the insulating material layers OSA and OSB may be simultaneously or sequentially formed. In accordance with some illustrative embodiments herein, the insulating material layers OSA and OSB may be deposited by known deposition processes. In some special illustrative examples, the insulating material layers OSA and OSB may be formed by an oxide material, such as silicon oxide, via TEOS and the like. For example, the insulating material layers OSA and OSB may have a thickness in a range from about 1-15 nm. After a complete reading of the present disclosure, the person skilled in the art will appreciate that the insulating material layers OSA and OSB are optional and are not construed as limiting to the present disclosure. Accordingly, in some alternative embodiments of the present disclosure, at least one of the insulating material layers OSA and OSB may be omitted.

FIG. 2f schematically illustrates the semiconductor device structure at a more advanced stage during fabrication, after a cleaning process is performed (optionally, without limitation of the present disclosure) and an insulating material layer 236A is formed over the first SOI region SOI-A and the first bulk region BULK-A. Furthermore, an insulating material layer 236B may be formed over the second SOI region SOI-B and the second bulk region BULK-B. In accordance with some illustrative embodiments, the insulating material layers 236A and 236B may be formed from the same insulating material, such as a nitride material, and/or may be sequentially or simultaneously formed. In accordance with some illustrative examples herein, a thickness of the insulating material layers 236A and 236B may be in a range from about 3-15 nm, such as in a range from about 5-10 nm, e.g., about 6 nm.

Although the insulating material layers OSA and OSB are not explicitly illustrated in FIGS. 2g-2x, the person skilled in the art will appreciate that this does not pose any limitation to the present disclosure and the insulating material layers may be understood as being formed underneath the insulating material layers 236A and 236B, respectively. Alternatively, the insulating material layers OSA and OSB may not be formed.

FIG. 2g schematically illustrates the semiconductor device structure at a more advanced stage during fabrication, after a mask M5A is formed over the first SOI region SOI-A and the first bulk region BULK-A. A mask M5B may be formed over the second bulk region BULK-B. Accordingly, the first SOI region SOI-A, the first bulk region BULK-A and the second bulk region BULK-B may be covered by the masks M5A and M5B, while the second SOI region SOI-B, and therefore the gate structure 210B, may be left uncovered. Accordingly, the second SOI region SOI-B is exposed to further processing.

FIG. 2h schematically illustrates the semiconductor device structure at a more advanced stage during fabrication, after an anisotropic etch process is performed. According to the anisotropic etch process, the insulating material layers 232B and 236B may be anisotropically etched such that sidewall spacers 233B and 231B may be formed and the gate cap 216B of the gate structure 210B may be exposed. The sidewall spacers 231B and 233B may provide a sidewall spacer structure Sp1-B to the gate structure 210B.

Figure 2I:
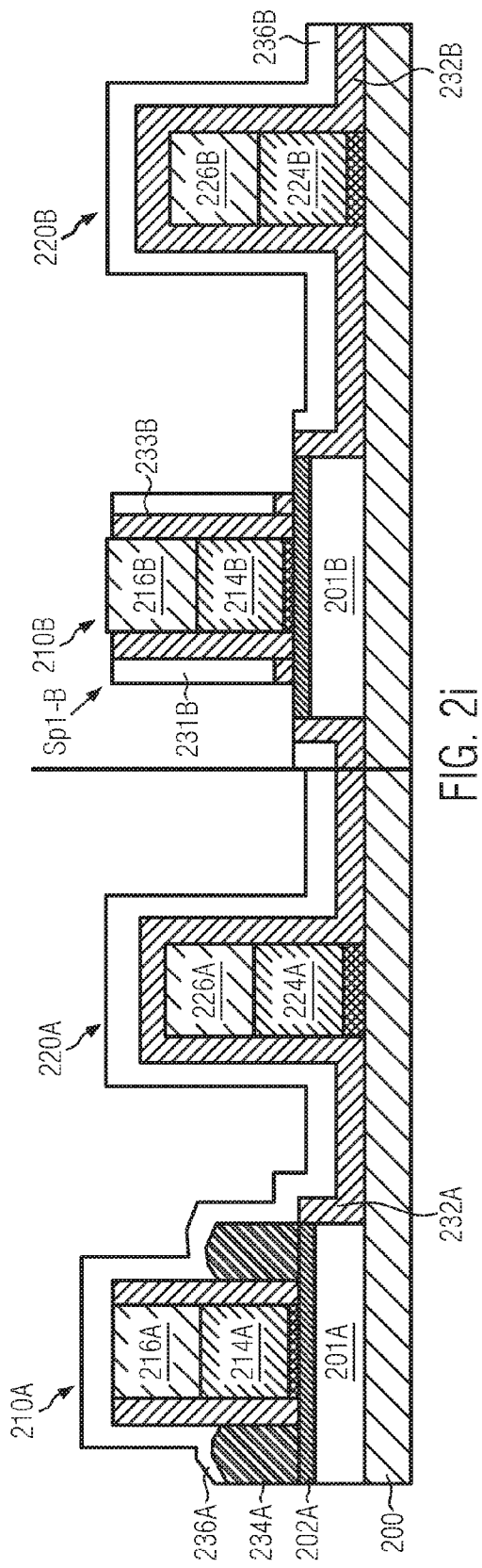

FIG. 2i schematically illustrates the semiconductor device structure at a more advanced stage during fabrication, after the masks M5A and M5B are removed and the first SOI region SOI-A, the first bulk region BULK-A, and the second bulk region BULK-B are exposed. The masks may be removed in accordance with known mask removal processes, such as mask stripping and the like.

Figure 2J:
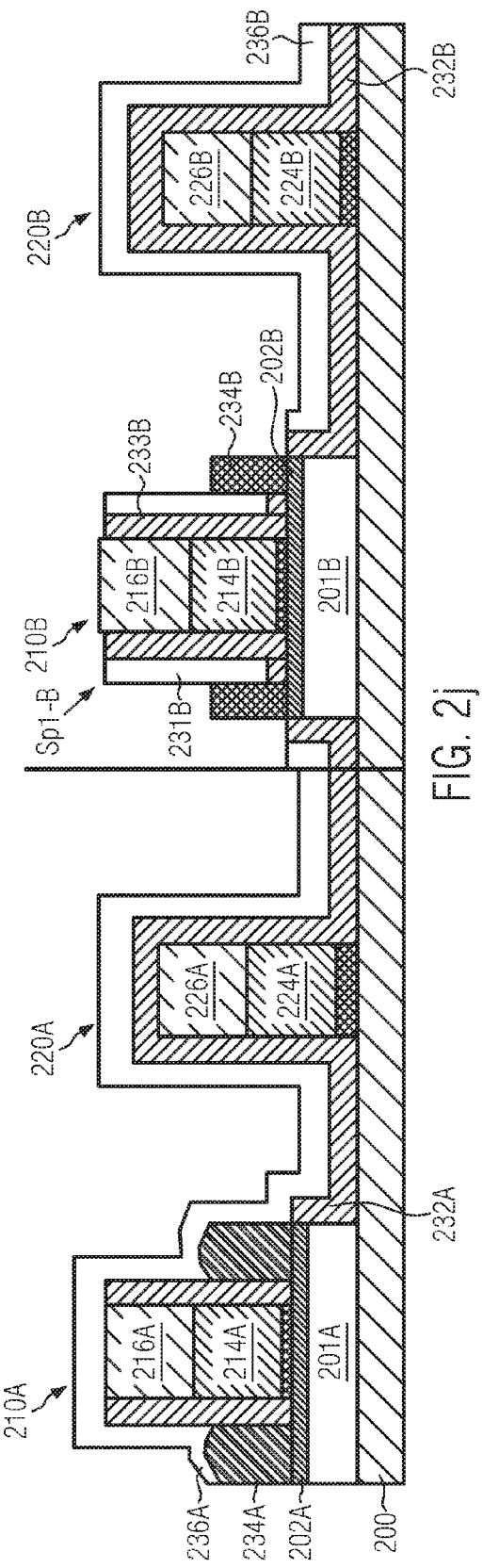

FIG. 2j schematically illustrates the semiconductor device structure at a more advanced stage during fabrication, after a precleaning process is performed for cleaning an upper surface of the active semiconductor layer 202B in the second SOI region SOI-B prior to an epitaxial growth process performed for growing raised source/drain regions 234B on the active semiconductor layer 202B in the second SOI region SOI-B adjacent to the gate structure 210B in alignment with the sidewall spacer structure Sp1-B. In accordance with some illustrative embodiments, the raised source/drain regions 234B may be in situ doped or may remain undoped. The person skilled in the art will appreciate that an appropriate material may be grown when forming the raised source/drain regions 234B, e.g., a semiconductor material, such as silicon, silicon carbon, silicon germanium and the like. The person skilled in the art will appreciate that the first SOI region SOI-A, the first bulk region BULK-A, and the second bulk region BULK-B may be protected during the precleaning and epitaxial growth processes via the insulating material layers 236A and 236B.

FIG. 2k schematically illustrates the semiconductor device structure at a more advanced stage during fabrication, after a mask M6A is formed over the first SOI region SOI-A, the mask M6A covering the first SOI region SOI-A and leaving the first bulk region BULK-A uncovered. A mask M6B may be formed over the second SOI region SOI-B, covering the second SOI region SOI-B and leaving the second bulk region BULK-B uncovered. The masks M6A and M6B may be formed in accordance with known masking and hardmasking techniques, respectively.

FIG. 2l schematically illustrates the semiconductor device structure at a more advanced stage during fabrication, after an etching process is applied in alignment with the masks M6A and M6B. In accordance with some illustrative embodiments, the etching process may comprise an anisotropic etching process, wherein the insulating material layers 232A and 236A may be anisotropically etched in the first bulk region BULK-A such that a sidewall spacer structure Sp2-A may be formed on the gate structure 220A and the gate cap 226A may be exposed. Furthermore, due to the anisotropic etching, the insulating material layers 232B and 236B may be anisotropically etched in the second bulk region BULK-B, wherein a sidewall spacer structure Sp2-B is formed on the gate structure 220B and the gate cap 226B may be exposed. The person skilled in the art will appreciate that the sidewall spacer structure Sp2-A may comprise a sidewall spacer 233A and a sidewall spacer 231A. Furthermore, the sidewall spacer structure Sp2-B may comprise a sidewall spacer 231B and a sidewall spacer 233B.

Figure 2M:
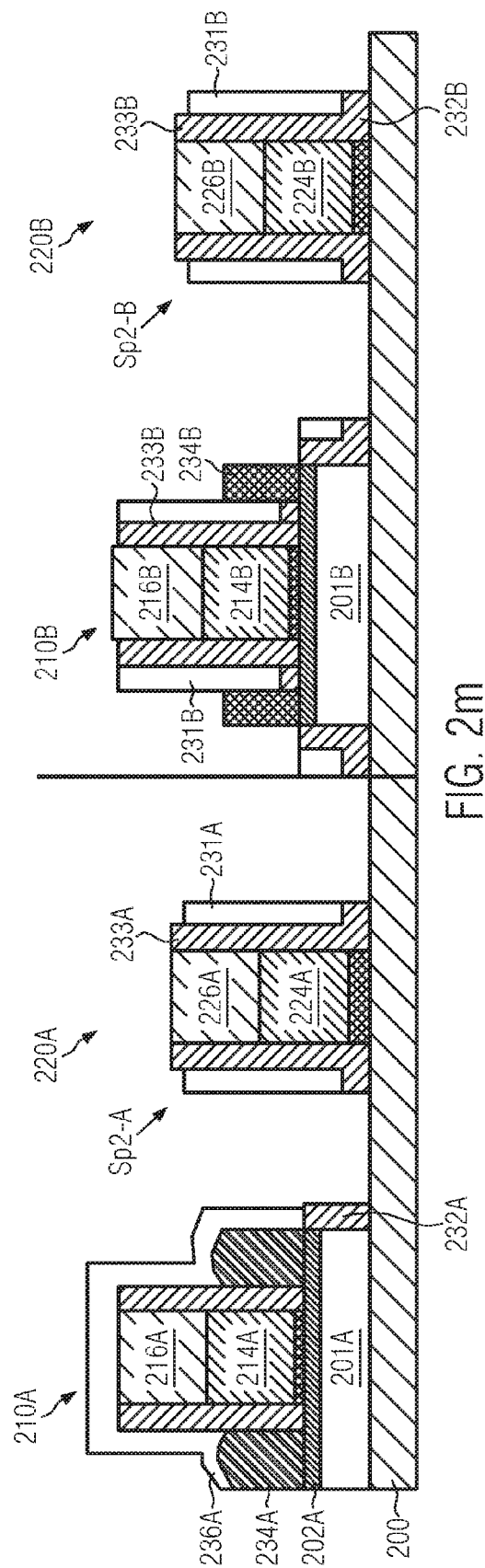

FIG. 2m schematically illustrates the semiconductor device structure at a more advanced stage during fabrication, after the masks M6A and M6B are removed. The person skilled in the art will appreciate that the masks M6A and M6B may be removed in accordance with known mask strip processes.

FIG. 2n schematically illustrates the semiconductor device structure at a more advanced stage during fabrication, after a mask M7A is formed over the first SOI region SOI-A and a mask M7B is formed over the second SOI region SOI-B and the second bulk region BULK-B. Accordingly, the bulk region by the first region BULK-A is exposed to further processing.

As depicted in FIG. 2n, an implantation process 245A may be performed for increasing a dopant density in the substrate 200 in the first bulk region BULK-A in alignment with the gate structure 220A and the sidewall spacer structure Sp2-A. In accordance with some illustrative embodiments of the present disclosure, the implantation process 245A may comprise a first implantation step with a first implantation dose and energy, and a second implantation step with a second implantation dose and energy. Herein, the first implantation dose and energy may be smaller than the second implantation dose and energy, respectively. In accordance with some illustrative examples, the first implantation step may be performed in order to form LDD regions via a tilted implantation, wherein the dopant density in the substrate 200 below the sidewall spacer structure Sp2-A is increased. The second implantation process may be oriented perpendicular to a surface UBKLK-A of the substrate 200 adjacent to the gate structure 220A, so as to form source/drain regions and deep source/drain regions, respectively.

FIG. 2o schematically illustrates the semiconductor device structure at a more advanced stage during fabrication, after the masks M7A and M7B are removed and a mask M8A covering the first SOI region SOI-A and the first bulk region BULK-A, and a mask M8B over the second SOI region SOI-B are formed, the mask M8B covering the second SOI region SOI-B. In accordance with the masks M8A and M8B, the second bulk region BULK-B may be exposed to further processing. As depicted in FIG. 2o, an implantation process 245B may be performed for increasing a dopant density in the substrate 200 in the second bulk region BULK-B in alignment with the gate structure 220B and the sidewall spacer structure Sp2-B. In accordance with some illustrative embodiments of the present disclosure, the implantation process 245B may comprise a first implantation step with a first implantation dose and energy, and a second implantation step with a second implantation dose and energy. Herein, the first implantation dose and energy may be smaller than the second implantation dose and energy, respectively. In accordance with some illustrative examples, the first implantation step may be performed in order to form LDD regions via a tilted implantation, wherein the dopant density in the substrate 200 below the sidewall spacer structure Sp2-B may be increased. The second implantation process may be oriented perpendicular to a surface UBKLK-B of the substrate 200 adjacent to the gate structure 220B so as to form source/drain regions and deep source/drain regions, respectively.

The person skilled in the art will appreciate that the order in which the implantation processes 245A and 245B are performed is not limiting to the present disclosure. In accordance with some illustrative embodiments (not illustrated), the implantation process 245B may be performed prior to the implantation process 245A.

FIG. 2p schematically illustrates the semiconductor device structure at a more advanced stage during fabrication, after the masks M8A and M8B are removed. In accordance with some illustrative embodiments, the masks M8A and M8B may be removed in accordance with known mask removal processes, such as mask stripping. Accordingly, the first SOI region SOI-A, the first bulk region BULK-A, and the second bulk region BULK-B are exposed to further processing.

As illustrated in FIG. 2q, an optional process may be performed at this stage during fabrication, the optional process comprising a formation of an oxide layer 238A over the first SOI region SOI-A and the first bulk region BULK-A, and forming an oxide layer 238B over the second SOI region SOI-B and the second bulk region BULK-B.

FIG. 2r illustrates the semiconductor device structure at a more advanced stage during fabrication, after a further optional process of etching the deposited oxide layers 238A and 238B and after an optional dry cap removal process for removing the gate caps 216A, 226A, 216B and 226B, leaving the gate electrodes 214A, 224A, 214B and 224B exposed to further processing. The person skilled in the art will appreciate that, due to the etch and dry cap removal, the sidewall spacers and sidewall spacer structures, respectively, to the gate structures 210A, 220A, 210B and 220B may be etched back or trimmed. Accordingly, the sidewall spacers and sidewall spacer structures, respectively, may be trimmed back to the level of the gate electrodes 214A, 224A, 214B and 224B.

FIG. 2s schematically illustrates the semiconductor device structure at a more advanced stage during fabrication, after a further optional process of removing leftovers of the deposited oxide layer 238A, 238B (see FIG. 2q) is performed.

Instead of the optional processes as described above with regard to FIGS. 2q-2s, the process may be continued after the stage as illustrated in FIG. 2p via the process as depicted in FIG. 2t. Herein, a DCR ("dry cap removal," e.g., comprising a dry etch process for cap removal) may be performed, if without oxidation.

After a complete reading of the present disclosure, the person skilled in the art will appreciate that an optional oxide removal may be performed at the stage as depicted in FIGS. 2q and 2s.

As a result of the DCR, the semiconductor device structure as depicted in FIG. 2u may be obtained, at which stage a rapid thermal anneal (RTA) may be performed, optionally after "spacer one formation" (247A and 247B in FIG. 2u).

FIG. 2v schematically illustrates the semiconductor device structure at a more advanced stage during fabrication, after an insulating material 249A, e.g., a silicon oxide liner (LDEP) material, is deposited, having a thickness in the range from 1-5 nm, e.g., about 3 nm. The insulating material may be used as an etch stop material during spacer etching, such as an LEDEP may be used as an etch stop during nitride spacer etchings.

FIG. 2w schematically illustrates the semiconductor device structure at a more advanced stage during fabrication, after deposition of a spacer material 251A, 251B. In accordance with some illustrative embodiments of the present disclosure, a nitride spacer may be formed, e.g., a silicon nitride deposition for spacer "one" (DEP) may be performed. In accordance with some illustrative embodiments, the deposited spacer material may have a thickness in a range from about 10-20 nm, e.g., about 15 nm.

FIG. 2x schematically illustrates the semiconductor device structure at a more advanced stage during fabrication, after an OP-blockmask is formed (not illustrated), an anisotropic etching process is performed for forming sidewall spacers structures 260A and 260B to the gate structures 220A and 220B in the first and second bulk regions BULK-A and BULK-B. Furthermore, an optional rapid thermal annealing may be performed, followed by an oxide removal step (not illustrated). In accordance with some illustrative embodiments, formation of the OP-blockmask comprises forming a silicide block mask which blocks nitride during nitride spacer etching such that no nitride material is removed so as to mask regions where no silicidation is to occur.

In some embodiments as described above in regard to FIGS. 2a-2x, the person skilled in the art will appreciate that a first spacer structure, e.g., the sidewall spacer structure Sp2-A and Sp2-B, respectively, in FIG. 2l may be replaced by a spacer structure 260A and 260B as depicted in FIG. 2x. Herein, replacing may comprise performing a sequence of etchings, wherein oxide and nitride layers of the spacer structures Sp2-A, Sp2-B may be totally removed and the sidewall spacers formed by anisotropically etching the insulating material layer 232A and 232B, respectively, may be partially removed, so as to leave a thin layer, e.g., a liner of nitride material, covering sidewalls of the gate structure as schematically illustrated in FIG. 2u and the following. Subsequently, the sidewall spacer structures 260A and 260B as depicted in FIG. 2x may be formed.

The person skilled in the art will appreciate that due to the LDD formation as discussed in connection with implantation processes 245A and 245B, hot carrier immunity of the bulk semiconductor devices may be achieved.

After a complete reading of the present disclosure, the person skilled in the art will appreciate that a process leading to the semiconductor device structure as depicted in FIG. 2l may comprise, in some illustrative embodiments of the present disclosure, formation of a first spacer structure (e.g., Sp2-A and/or Sp2-B), comprising depositing of an oxide layer and a nitride layer over at least one active region over a bulk substrate (e.g., BULK-A and/or BULK-B), e.g., as it is shown in FIG. 2f, forming a mask on possible SOI regions (e.g., SOI-A, SOI-B), see, for example, masks M6A and M6B in FIG. 2k, wherein the active region(s) over bulk remain exposed, and anisotropically etching the exposed deposited oxide and nitride layers, wherein the first spacer structure is formed and upper surface regions of the bulk substrate are exposed in alignment with the mask and the accordingly formed first spacer structure.

Some illustrative embodiments as described above with regard to FIGS. 2a-2x show a process of co-integrating gate structures having a relatively thick gate dielectric (e.g., gate structures 220A and 220B) sustaining a high Vdd (of about 2.5-3.3 V) together with low Vdd devices in SOI technology, particularly FDSOI. For example, SOI, possibly FDSOI, devices (e.g., gate structures 210A and 210B) may be built, a masked epi may be grown on ZG bulk devices (N-/P-epi, e.g., via a first bulk region Bulk-A and second bulk region Bulk-B; a first bulk region Bulk-A being of N-type and second bulk region Bulk-B being of P-type, or vice versa). Optionally, spacers may be removed from at least one of the bulk ZG gate cap by a masked dry etch, while sidewall spacers may not be affected. Furthermore, bulk device junctions (optionally with additional HALO implantations) may be implanted, possibly with LDD formation for improved hot carrier immunity. According to some illustrative embodiments of the present disclosure, the gate caps may be removed via a dry cap removal and a rapid thermal anneal (RTA) may be performed for junction annealing, optionally before silicidation. In accordance with some illustrative embodiments, an OP liner and spacer may be deposited and etched to enable silicidation. The semiconductor device may be further processed in accordance with conventional techniques, i.e., POR.

In accordance with some illustrative embodiments of the disclosure as described above, the various insulating material layers may be formed by an oxide material and/or a nitride material. This does not pose any limitation on the present disclosure and, after a complete reading of the present disclosure, the person skilled in the art will appreciate that at least one of the various insulating material layers may comprise a low-k material, such as SiBCN, SiOCN, SiCN and the like.

In accordance with some illustrative embodiments of the present disclosure, no substantially new and risky steps may be employed, posing a potential risk on device reliability. Furthermore, spacer breakdown issues may be solved by ZG devices on bulk.

After a complete review of the present disclosure, the person skilled in the art will understand that the ZG process may be plugged on POR as separate module, while thin oxide device suit is unchanged.

After a complete reading of the present disclosure, the person skilled in the art will appreciate that, in accordance with some illustrative embodiments as described above in regard to FIGS. 2a-2x, a co-integration of devices without in situ doped raised source/drain regions on FDSOI in hard mask techniques is enabled. Furthermore, a process as described with regard to at least some illustrative embodiments may be modular and may only require some separate masking. The person skilled in the art will appreciate that at least some of the processes as described above with regard to FIGS. 2a-2x may represent a front up approach for the co-integration of elevated Vdd devices on 22 nm FDSOI techniques and beyond.

After a complete reading of the present disclosure, the person skilled in the art will appreciate that, in accordance with some illustrative embodiments, the present disclosure shows formation of SOI and/or bulk devices with a different gate dielectric thickness to SG devices on SOI. In accordance with some illustrative embodiments, a device co-integration featuring in situ doped epitaxially grown source/drain regions on SOI and implanted junctions on bulk are shown.

After a complete reading of the present disclosure, the person skilled in the art will appreciate that, in accordance with some illustrative embodiments, the present disclosure shows a formation of devices on SOI with different dielectric thicknesses, i.e., relatively great dielectric thickness, and epitaxially grown source/drain regions, that is, a formation of thick oxide devices on SOI with Vdd of about 1.8 V, and on bulk with Vdd greater than 1.8 V, but different junctions. Further embodiments show a complexity optimized possible process flow. The person skilled in the art will appreciate that a late gate cap removal process may be performed to avoid dope and penetration through gate stack during source/drain implantation. Optionally, OP spacers may be used for bulk device implantation instead of etched N-/P-spacers as discussed above with regard to some embodiments regarding FIGS. 2a-2x.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device structure, comprising:
providing a first active region and a second active region in an upper surface portion of a substrate, wherein said substrate is configured in said first active region to comprise an active semiconductor layer, a buried insulating material, and a semiconductor substrate material, said buried insulating material being interposed between said active semiconductor layer and said semiconductor substrate material;
forming a first gate structure comprising a first gate dielectric and a first gate electrode material over said first active region directly on said active semiconductor layer, and a second gate structure comprising a second gate dielectric and a second gate electrode material over said second active region, wherein a thickness of said second gate dielectric is greater than a thickness of said first gate dielectric, wherein said second gate structure is formed directly on an upper surface of said semiconductor substrate material which is exposed in said second portion;
depositing a first sidewall spacer material layer over said first and second gate structures;
forming a first mask over said second active region, leaving said first active region exposed to further processing;
anisotropically etching said first sidewall spacer material, wherein a first sidewall spacer is formed on said first gate structure and upper surface regions of said active semiconductor layer in said first active region are exposed in alignment with said first mask and said first sidewall spacer;
epitaxially growing raised source/drain regions on said exposed upper surface regions;
removing said first mask;
forming a first spacer structure over said second gate structure;
forming a second mask over said first active region, leaving said second active region exposed to further processing;
performing an implantation process for increasing a doping level in said second active region in alignment with said second gate structure and said first spacer structure;
removing said second mask; and
replacing said first spacer structure by a second spacer structure on said second gate structure.

2. The method of claim 1, wherein said implantation process comprises a first step of implanting dopants at a first implantation dose and energy, and a second step of implanting dopants at a second implantation dose and energy, wherein said first implantation dose and energy are lower than said second implantation dose and energy.

3. The method of claim 1, wherein forming said first spacer structure comprises:
depositing an oxide layer and a nitride layer over said first and second active regions;
forming a third mask on said first active region, leaving said second active region exposed to further processing; and
anisotropically etching said deposited oxide and nitride layers, and said first sidewall spacer material over said second gate structure, wherein said first spacer structure is formed and upper surface regions in said second portion are exposed in alignment with said third mask and said first spacer structure.

4. The method of claim 1, wherein a thickness of said second gate dielectric is greater than a thickness of said first gate dielectric.

5. The method of claim 1, wherein said epitaxially growing of said raised source/drain regions is configured to form in situ doped raised source/drain regions.

6. The method of claim 1, wherein said second gate structure further comprises a gate cap, said gate cap being removed after said implantation step is completed.

7. The method of claim 2, wherein said first step of implanting dopants is a tilted implant and said second step of implanting dopants is orthogonal relative to a normal direction of an upper surface of said first and second active regions.

8. The method of claim 3, wherein said first spacer structure comprises said first sidewall spacer material layer, and said oxide and nitride layers, and wherein said replacing of said first spacer structure comprises:
performing a sequence of etchings, wherein said oxide and nitride layers are totally removed and said first sidewall spacer material layer is partially removed so as to leave a liner covering sidewalls of said second gate structure;
depositing a nitride material layer and an oxide material layer, each of which having a predetermined thickness; and
exposing said deposited nitride and oxide material layers so as to form said second sidewall spacer structure.

9. The method of claim 4, wherein a thickness of said first sidewall spacer material layer is less than a thickness of said second sidewall spacer structure.

* * * * *